United States Patent
Ching et al.

(10) Patent No.: US 11,522,074 B2
(45) Date of Patent: Dec. 6, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuo-Cheng Ching, Hsinchu County (TW); Kuan-Lun Cheng, Hsinchu (TW); Chih-Hao Wang, Hsinchu County (TW); Keng-Chu Lin, Pingtung County (TW); Shi-Ning Ju, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/200,226

(22) Filed: Mar. 12, 2021

(65) Prior Publication Data

US 2021/0202715 A1     Jul. 1, 2021

Related U.S. Application Data

(63) Continuation of application No. 16/714,532, filed on Dec. 13, 2019, now Pat. No. 10,950,714, which is a
(Continued)

(51) Int. Cl.
*H01L 27/088*     (2006.01)
*H01L 21/762*     (2006.01)
(Continued)

(52) U.S. Cl.
CPC ...... *H01L 29/6681* (2013.01); *H01L 21/0228* (2013.01); *H01L 21/76224* (2013.01);
(Continued)

(58) Field of Classification Search
CPC ............. H01L 29/6681; H01L 21/0228; H01L 21/76224; H01L 21/76229;
(Continued)

(56) References Cited

U.S. PATENT DOCUMENTS 8,836,016 B2 *   9/2014   Wu .................... H01L 21/02658
                                                                               257/E29.267
8,841,701 B2 *   9/2014   Lin ........................ H01L 29/045
                                                                                 257/65
(Continued)

*Primary Examiner* — Earl N Taylor
(74) *Attorney, Agent, or Firm* — Maschoff Brennan

(57) ABSTRACT

A semiconductor device includes a substrate, a first semiconductor fin, a second semiconductor fin, a gate structure, a plurality of source/drain structures, a shallow trench isolation (STI) oxide, and a dielectric layer. The first semiconductor fin extends upwardly from the substrate. The second semiconductor fin extends upwardly from the substrate. The gate structure extends across the first and second semiconductor fins. The source/drain structures are on the first and second semiconductor fins. The STI oxide extends continuously between the first and second semiconductor fins and has a U-shaped profile when viewed in a cross section taken along a lengthwise direction of the gate structure. The dielectric layer is partially embedded in the STI oxide and has a U-shaped profile when viewed in the cross section taken along the lengthwise direction of the gate structure.

20 Claims, 36 Drawing Sheets

Related U.S. Application Data continuation of application No. 15/883,684, filed on Jan. 30, 2018, now Pat. No. 10,510,874.

(60) Provisional application No. 62/592,852, filed on Nov. 30, 2017.

(51) Int. Cl.
*H01L 21/8234* (2006.01)
*H01L 29/66* (2006.01)
*H01L 29/06* (2006.01)
*H01L 21/02* (2006.01)

(52) U.S. Cl.
CPC .......... *H01L 21/76229* (2013.01); *H01L 21/823431* (2013.01); *H01L 21/823481* (2013.01); *H01L 27/0886* (2013.01); *H01L 29/0649* (2013.01); H01L 21/0217 (2013.01); H01L 21/02126 (2013.01); H01L 21/02167 (2013.01); H01L 21/02181 (2013.01); H01L 21/02189 (2013.01)

(58) Field of Classification Search
CPC ..... H01L 21/823431; H01L 21/823481; H01L 27/0886; H01L 29/0649; H01L 21/02126; H01L 21/02167; H01L 21/0217; H01L 21/02181; H01L 21/02189
See application file for complete search history.

(56) References Cited

U.S. PATENT DOCUMENTS

| | | | | |
|---|---|---|---|---|
| 8,847,293 B2* | 9/2014 | Lee | H01L 29/66795 | 257/288 |
| 8,853,025 B2* | 10/2014 | Zhang | H01L 27/0924 | 438/173 |
| 8,962,400 B2* | 2/2015 | Tsai | H01L 29/7848 | 438/300 |
| 9,093,514 B2* | 7/2015 | Tsai | H01L 29/66477 | |
| 9,236,267 B2* | 1/2016 | De | H01L 27/1211 | |
| 9,245,805 B2* | 1/2016 | Yeh | H01L 21/02535 | |
| 9,508,604 B1* | 11/2016 | Sung | H01L 27/0924 | |
| 9,520,482 B1* | 12/2016 | Chang | H01L 21/823864 | |
| 9,559,185 B2* | 1/2017 | Tak | H01L 29/161 | |
| 9,576,814 B2* | 2/2017 | Wu | H01L 21/30604 | |
| 9,773,901 B1* | 9/2017 | Gluschenkov | H01L 29/66666 | |
| 9,947,769 B1* | 4/2018 | Han | H01L 21/0214 | |
| 10,008,497 B2* | 6/2018 | Lee | H01L 29/165 | |
| 10,037,912 B2* | 7/2018 | Hsiao | H01L 21/28008 | |
| 10,062,577 B1* | 8/2018 | Hung | H01L 29/1054 | |
| 10,106,892 B1* | 10/2018 | Siddiqui | C01B 21/0825 | |
| 10,276,449 B1* | 4/2019 | Wu | H01L 21/31111 | |
| 10,297,597 B2* | 5/2019 | Sung | H01L 21/31111 | |
| 2006/0118876 A1* | 6/2006 | Lee | H01L 29/66795 | 438/176 |
| 2008/0050898 A1* | 2/2008 | Luan | H01L 29/517 | 438/585 |
| 2014/0227858 A1* | 8/2014 | Shen | H01L 21/02123 | 438/430 |
| 2014/0374838 A1* | 12/2014 | Chen | H01L 27/0886 | 257/401 |
| 2015/0255581 A1* | 9/2015 | Lin | H01L 21/02337 | 438/424 |
| 2016/0336237 A1* | 11/2016 | Lee | H01L 21/76224 | |
| 2016/0365426 A1* | 12/2016 | Ching | H01L 29/6656 | |
| 2016/0372567 A1* | 12/2016 | Tak | H01L 29/165 | |
| 2017/0076989 A1* | 3/2017 | Chang | H01L 29/66545 | |
| 2017/0110552 A1* | 4/2017 | Lee | H01L 29/517 | |
| 2017/0323955 A1* | 11/2017 | Rachmady | H01L 29/7851 | |
| 2018/0096998 A1* | 4/2018 | Sung | H01L 21/823431 | |
| 2018/0102291 A1* | 4/2018 | Brunco | H01L 21/823431 | |
| 2018/0151565 A1* | 5/2018 | Lee | H01L 21/76802 | |
| 2018/0166327 A1* | 6/2018 | Hsiao | H01L 27/0886 | |
| 2018/0219009 A1* | 8/2018 | Liu | H01L 29/66795 | |
| 2018/0226489 A1* | 8/2018 | Bi | H01L 29/7827 | |
| 2018/0226491 A1* | 8/2018 | Bi | H01L 29/0649 | |
| 2018/0263684 A1* | 9/2018 | Lee | H01L 21/76831 | |
| 2018/0315840 A1* | 11/2018 | Chui | H01L 21/3105 | |
| 2018/0337088 A1* | 11/2018 | Hsiao | H01L 21/76802 | |
| 2018/0337234 A1* | 11/2018 | Zhao | H01L 29/785 | |
| 2019/0006228 A1* | 1/2019 | Huang | H01L 21/823481 | |
| 2019/0035691 A1* | 1/2019 | Okuno | H01L 29/66545 | |
| 2019/0067445 A1* | 2/2019 | Ching | H01L 29/0847 | |
| 2019/0067446 A1* | 2/2019 | Ching | H01L 29/6681 | |
| 2019/0097021 A1* | 3/2019 | Ching | H01L 29/6681 | |
| 2019/0097054 A1* | 3/2019 | Kim | H01L 21/8232 | |
| 2019/0103265 A1* | 4/2019 | Kao | H01L 27/0886 | |
| 2019/0103276 A1* | 4/2019 | Peng | H01L 21/02167 | |
| 2019/0103304 A1* | 4/2019 | Lin | H01L 29/6681 | |
| 2019/0103309 A1* | 4/2019 | Lin | H01L 29/7851 | |
| 2019/0122932 A1* | 4/2019 | Zhou | H01L 21/0217 | |
| 2019/0157156 A1* | 5/2019 | Chen | H01L 21/823431 | |

* cited by examiner

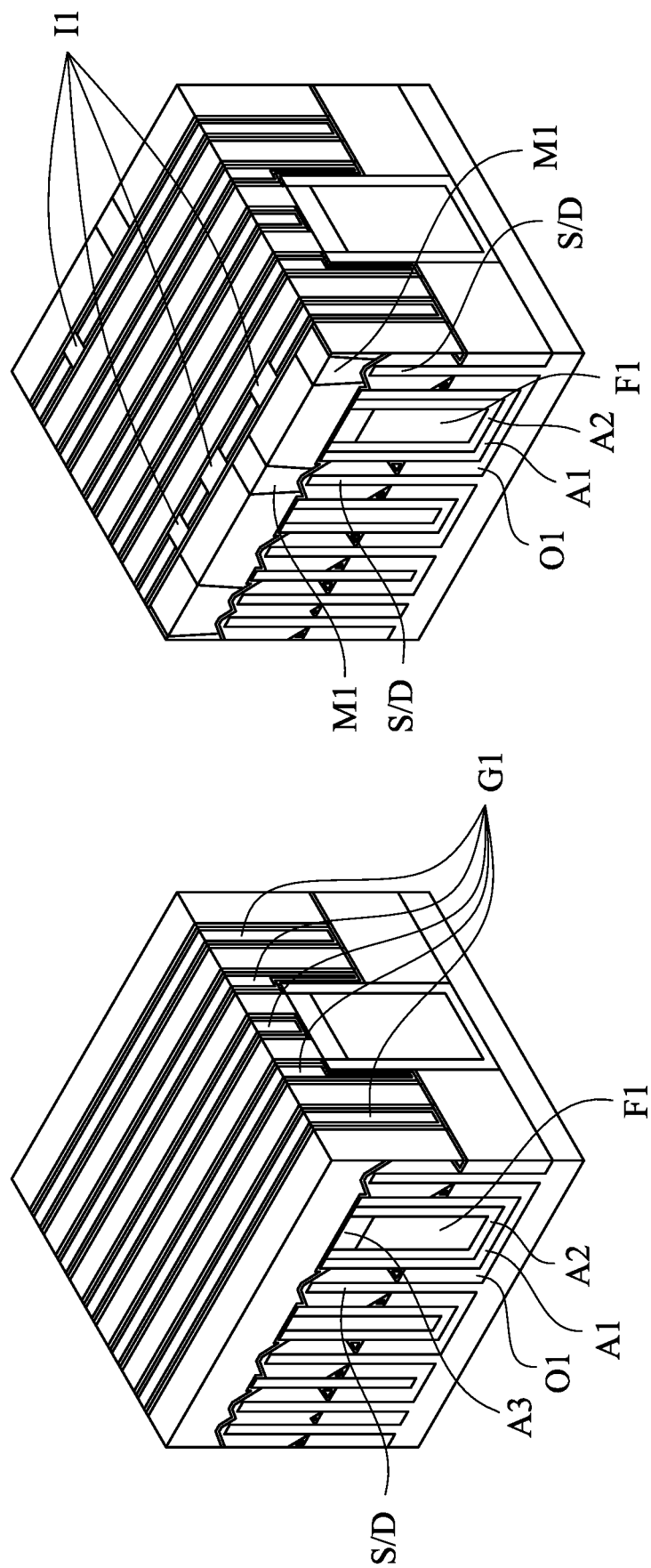

SEMICONDUCTOR DEVICE AND MANUFACTURING METHOD THEREOF

RELATED APPLICATIONS

The present application is a continuation application of U.S. application Ser. No. 16/714,532, filed Dec. 13, 2019, now U.S. Pat. No. 10,950,714, issued on Mar. 16, 2021, which is a continuation Application of the U.S. application Ser. No. 15/883,684, filed on Jan. 30, 2018, U.S. Pat. No. 10,510,874, issued on Dec. 17, 2019, which claims priority to U.S. Provisional Application Ser. No. 62/592,852, filed Nov. 30, 2017, which is herein incorporated by reference in their entirety.

BACKGROUND

Isolation structures such as dummy fins are used for isolating fins in semiconductor structures. However, when the dummy fins are formed, in some conditions, the quality of the dummy fins is poor, which results in deteriorating the dummy fins during wet or dry processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 36-49 are process flows for manufacturing the semiconductor device in FIG. 32, in accordance with some embodiments of the present disclosure.

DETAILED DESCRIPTION

Figure 1:
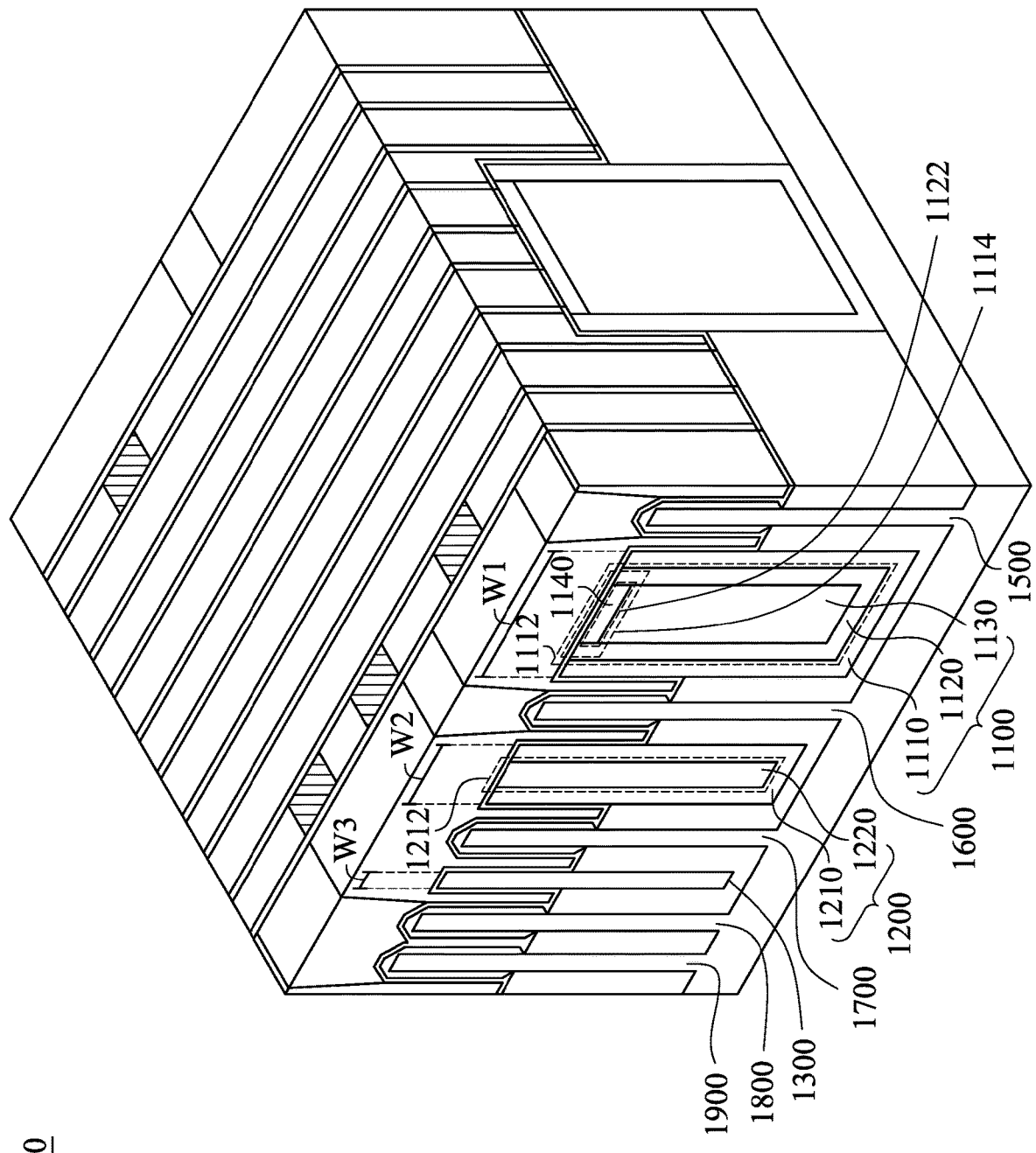
FIG. 1 is a schematic diagram of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Reference is made to FIG. 1. FIG. 1 is a schematic diagram of a semiconductor device 1000, in accordance with some embodiments of the present disclosure.

As illustratively shown in FIG. 1, the semiconductor device 1000 includes isolation regions 1100, 1200, 1300. Fins 1600, 1700 are arranged between the plurality of isolation regions 1100, 1200, 1300. For illustration, the fin 1600 is arranged between the isolation regions 1100, 1200, and the fin 1700 is arranged between the isolation regions 1200, 1300. In various embodiments, the plurality of isolation regions 1100, 1200, 1300 are used as dummy fins.

In various embodiments, one of the plurality of isolation regions, for example, the isolation region 1100, includes a first atomic layer deposition (ALD) layer 1110, a second ALD layer 1120, a flowable chemical vapor deposition (FCVD) layer 1130, and a third ALD layer 1140. The first ALD layer 1110 includes a first trench 1112. The second ALD layer 1120 is formed in the first trench 1112 of the first ALD layer 1110. The FCVD layer 1130 is formed in the first trench 1112 of the first ALD layer 1110 and on the second ALD layer 1120. The third ALD layer 1140 is formed on the FCVD layer 1130.

In some embodiments, the third ALD layer 1140 is also formed in the first trench 1112 of the first ALD layer 1110 and on the FCVD layer 1130. In various embodiments, the third ALD layer 1140 is in contact with the second ALD layer 1120 and the FCVD layer 1130.

In various embodiments, the first ALD layer 1110 includes a first opening 1114, and the second ALD layer 1120 includes a second opening 1122. The first opening 1114 and the second opening 1122 are disposed at the same side, for example, the upper side of the semiconductor device 1000 as illustrated in FIG. 1. In some embodiments, the third ALD layer 1140 covers the second opening 1122 of the second ALD layer 1120. In various embodiments, the third ALD layer 1140 is in contact with the second ALD layer 1120 and the FCVD layer 1130.

In some embodiments, one of the plurality of isolation regions, for example, the isolation region 1200, includes a fourth ALD layer 1210 and a fifth ALD layer 1220. The fourth ALD layer 1210 includes a second trench 1212. The fifth ALD layer 1220 is formed in the second trench 1212 of the fourth ALD layer 1210.

In various embodiments, a width of one of the plurality of isolation regions is larger than a width of another one of the plurality of isolation regions. For illustration in FIG. 1, the width W1 of the isolation region 1100 is larger than the width W2 of the isolation region 1200. For another illustration, the width W2 of the isolation region 1200 is larger than the width W3 of the isolation region 1300. The widths of the isolation regions in the semiconductor device 1000 described above is given for illustrative purposes. Various widths of the isolation regions in the semiconductor device 1000 are within the contemplated scope of the present disclosure.

In various embodiments, the materials of the first ALD layer 1110 and the third ALD layer 1140 are selected from a group consisting of SiOC, SiOCN, and metal oxide such as $HfO_2$, $ZrO_2$. The material of the second ALD layer 1120 is selected from a group consisting of SiN, SiCN, and SiOCN. The materials of the ALD layers described above are given for illustrative purposes. Various materials of the ALD layers are within the contemplated scope of the present disclosure.

In some approaches, quality of FCVD layers in isolation regions are poor, and the FCVD layers would result in loss of the dummy fins during wet or dry processes.

Compared to the approaches above, in the present disclosure, the FCVD layer 1130 of the isolation region 1100 is surrounded by the second ALD layer 1120 and the third ALD layer 1140. Moreover, the first ALD layer 1110 further surrounds the FCVD layer 1130, the second ALD layer 1120 and the third ALD layer 1140. Accordingly, the FCVD layer 1130 is protected by the first ALD layer 1110, the second ALD layer 1120 and the third ALD layer 1140.

The structure of the semiconductor device 1000 described above is given for illustrative purposes. Various structures of the semiconductor device 1000 are within the contemplated scope of the present disclosure.

FIGS. 2-13 are process flows of manufacturing the semiconductor device 1000 in FIG. 1, in accordance with some embodiments of the present disclosure.

Figure 2:
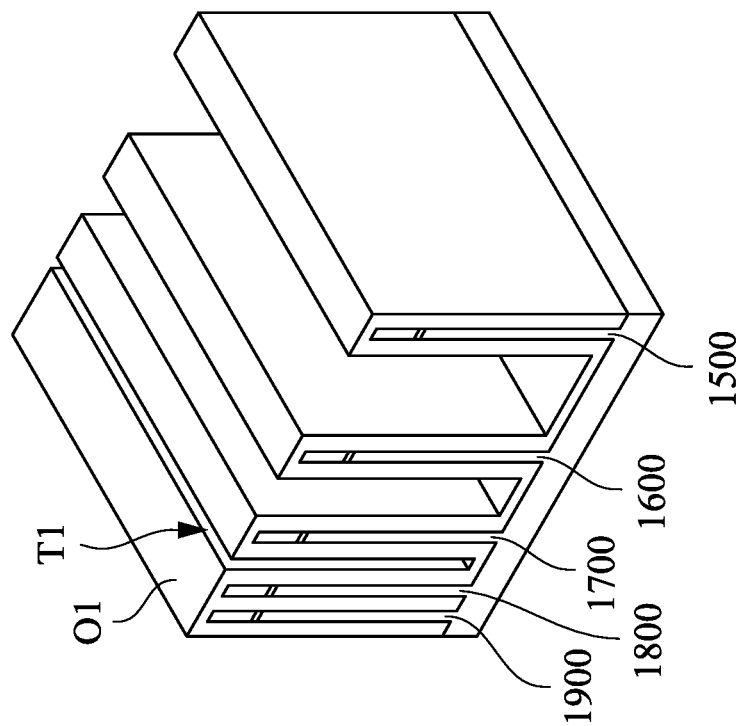

As illustratively shown in FIG. 2, a plurality of fins 1500, 1600, 1700, 1800, 1900 are formed by etching process, and an oxide layer O1 is formed on the fins 1500, 1600, 1700, 1800, 1900. With the formation of the fins 1500, 1600, 1700, 1800, 1900 and the oxide layer O1, a trench T1 is formed accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 3:
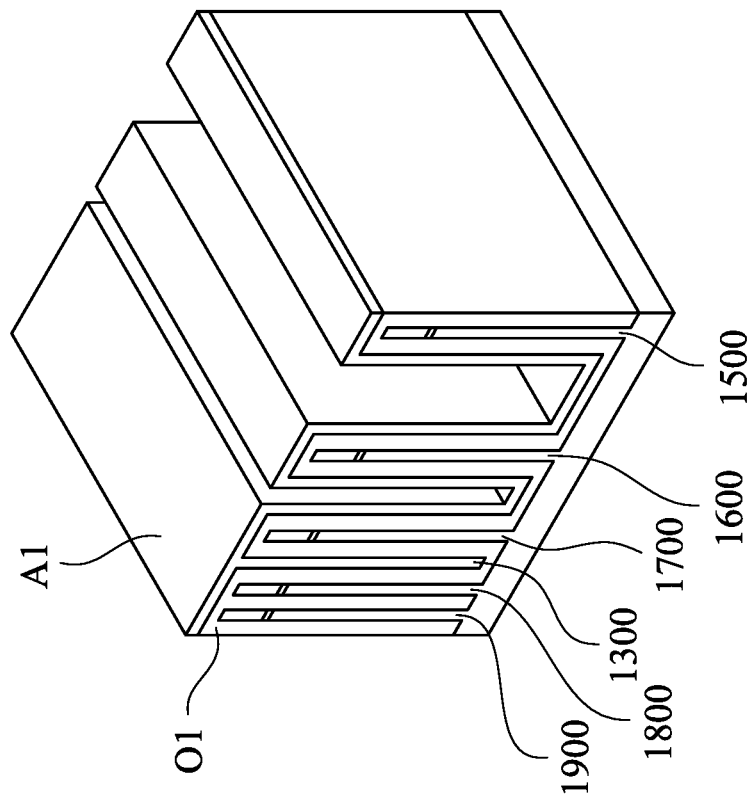
FIGS. 2-13 are process flows for manufacturing the semiconductor device in FIG. 1, in accordance with some embodiments of the present disclosure.

With reference to FIG. 3, an ALD material A1, used as an oxide spacer, is formed on the oxide layer O1, and disposed over the fins 1500, 1600, 1700, 1800, 1900. The ALD layer 1300 as a dummy fin is therefore formed in the trench T1 as shown in FIG. 2.

Figure 5:
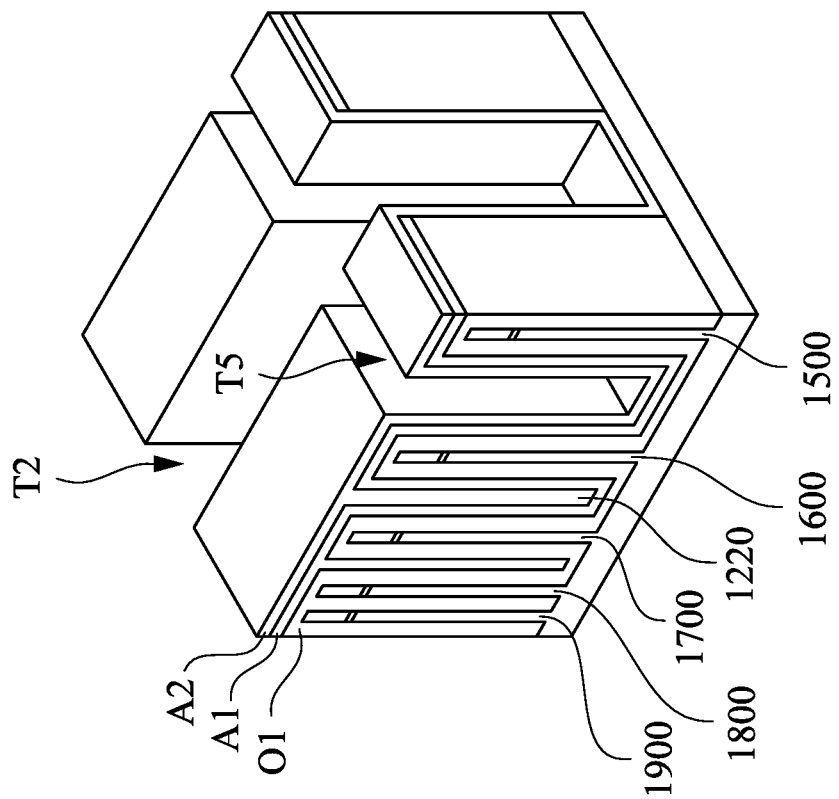
Figure 4:
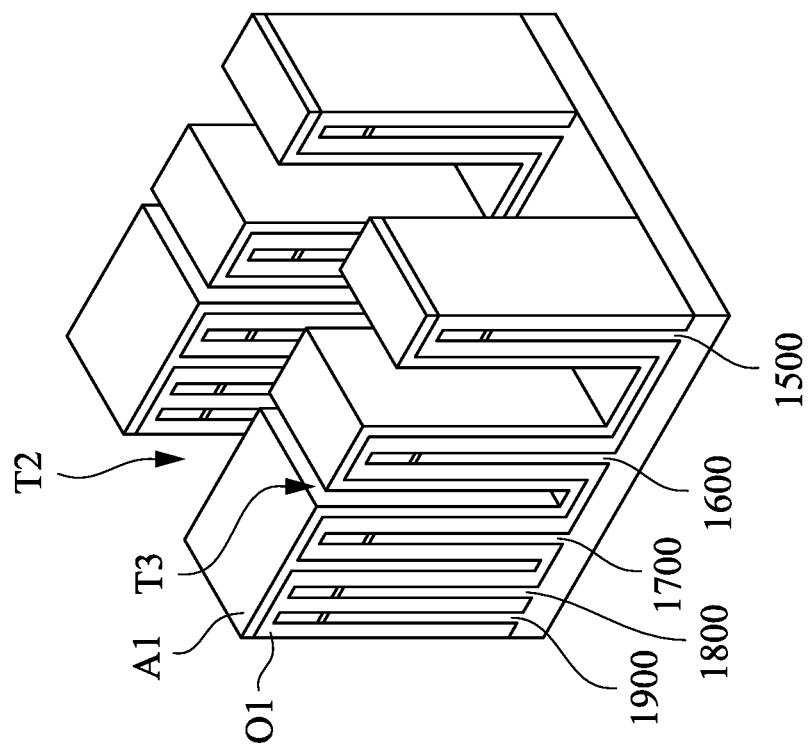

As illustratively shown in FIG. 4, coarse cut etching is performed to the fins 1500, 1600, 1700, 1800, 1900, the oxide layer O1 and the ALD material A1, and a new trench T2 is formed. Reference is made to FIG. 5, an ALD material A2 as Chemical-Mechanical Polishing (CMP) stop layer or etching stop layer is formed on the structure in FIG. 4. The ALD layer 1220 as a dummy fin is therefore formed in the trench T3 as shown in FIG. 4.

Figure 7:
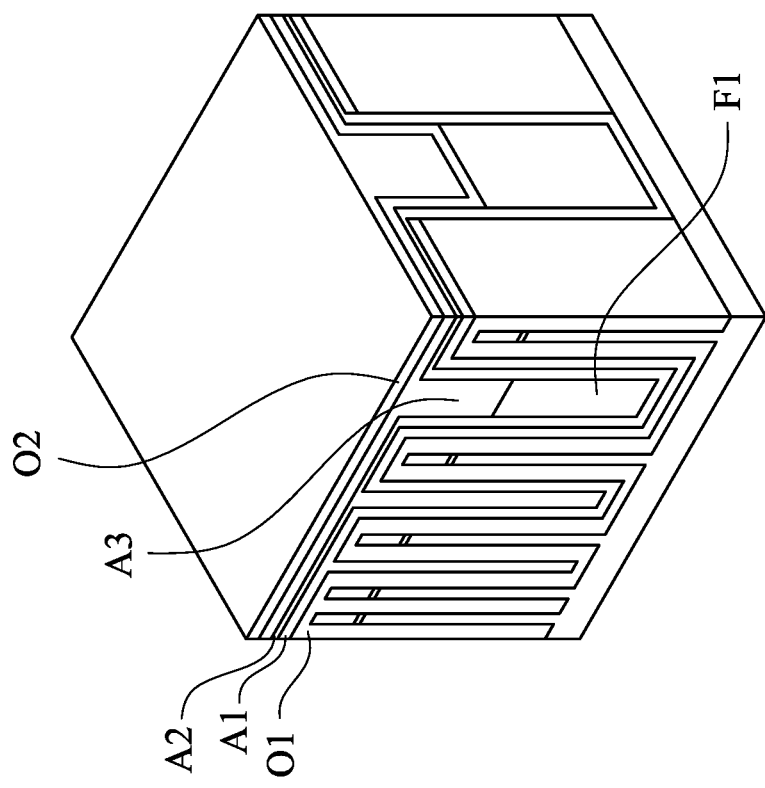
Figure 6:
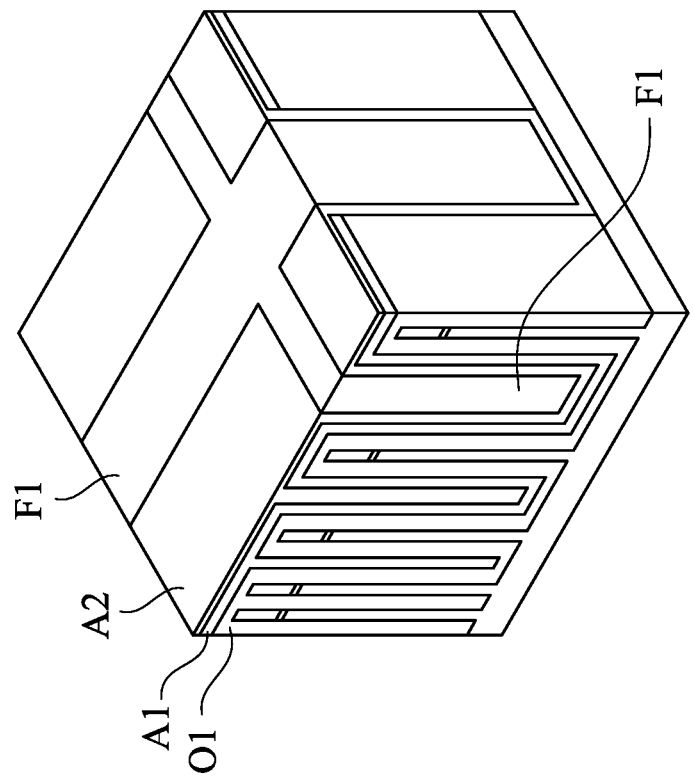

Reference is made to FIG. 6, a FCVD layer F1 is formed on the structure in FIG. 5 first, and a CMP process is performed to the formed structure afterwards. Since the ALD material A2 is used as a CMP stop layer, the FCVD layer F1 is polished and stopped at the ALD material A2. Accordingly, the FCVD layer F1 fills in the trench T2 and the trench T5 as shown in FIG. 5. In FIG. 7, an oxide recess process is preformed to recess the FCVD layer F1, and the upper portion of the FCVD layer F1 is removed. Subsequently, an ALD material A3 is formed on the recessed structure as mentioned above, and an oxide layer O2 is formed on the ALD material A3.

Figure 9:
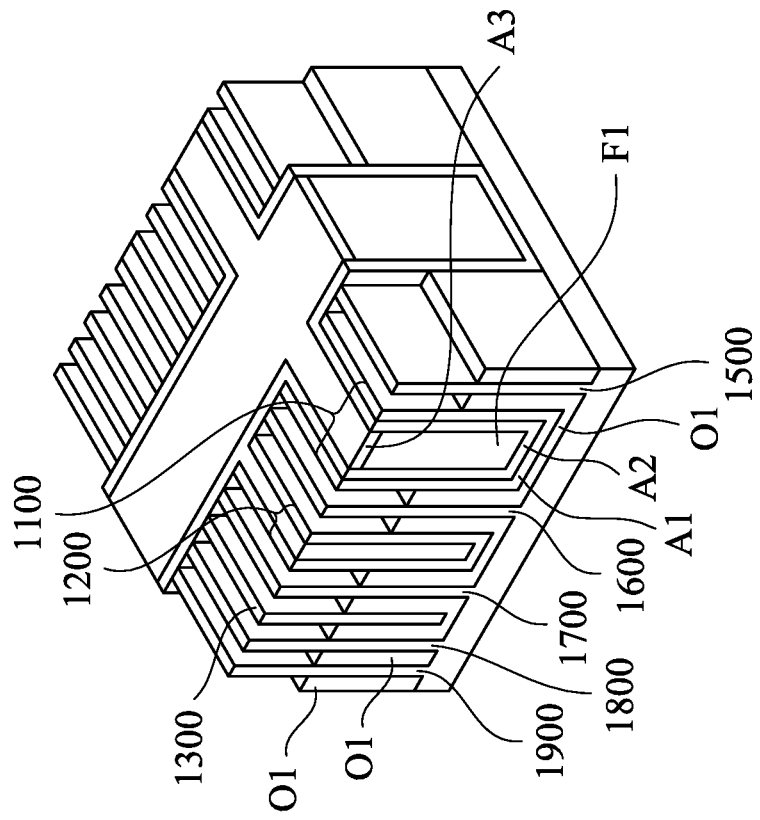
Figure 8:
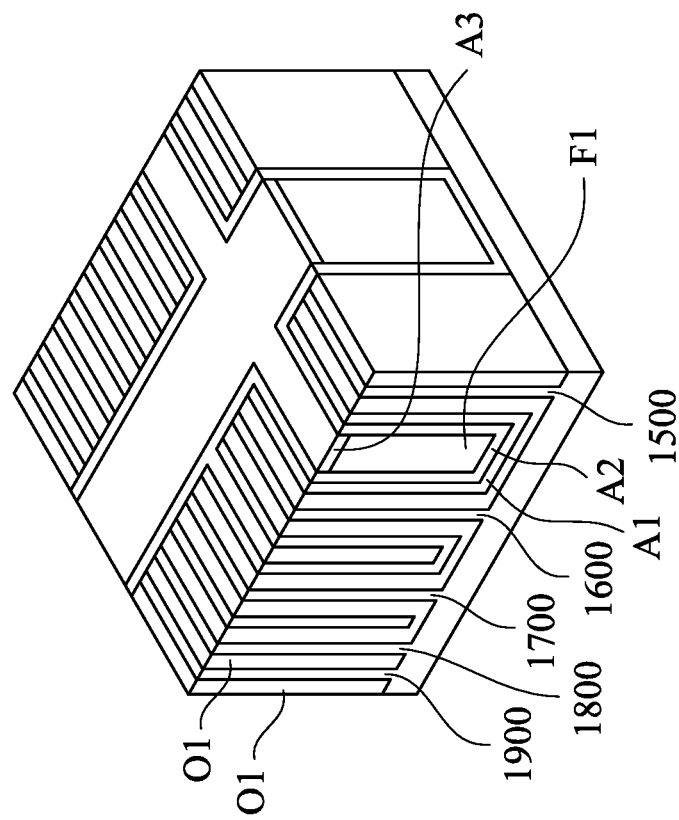

As illustratively shown in FIG. 8, a CMP process is performed. The oxide layer O2 is therefore removed, and the upper portions of the oxide layer O1, the ALD layers A1, A2, A3 are also removed. Referring to FIG. 9, a Shallow Trench Isolation (STI) recess process is performed. The upper portion of the oxide layer O1 is removed, and the fin structures such as the fins 1500-1900 and the isolation regions 1100, 1200, 1300 as dummy fins are therefore formed.

Figure 11:
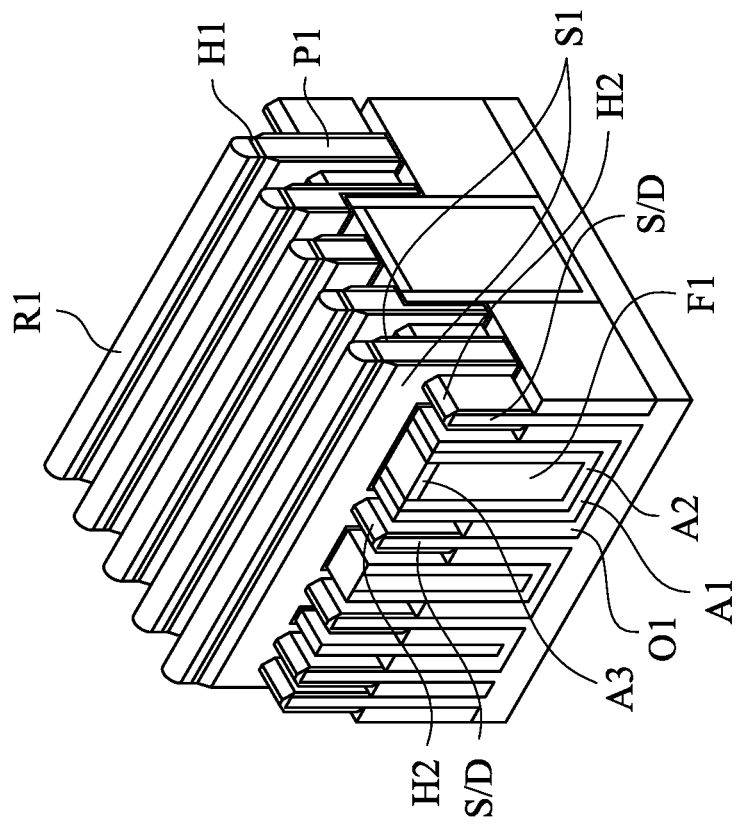
Figure 10:
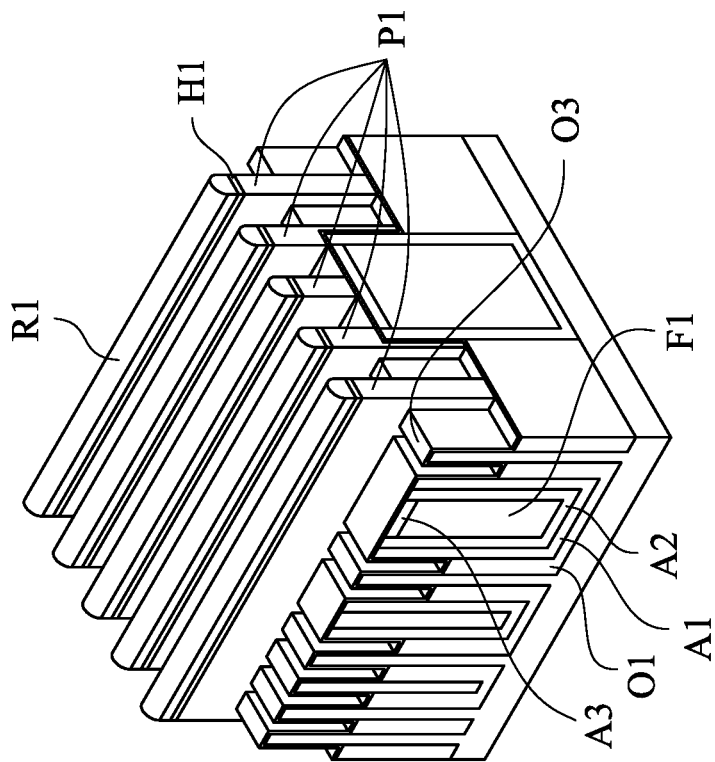

With reference to FIG. 10, a dummy oxide layer O3 as a gate dielectric layer is disposed on the fins 1500-1900 and the isolation regions 1100-1300 as dummy fins, and a poly layer used for forming poly patterns P1 is disposed on the dummy oxide layer O3. Subsequently, photo resists R1 and hard masks H1 are disposed on the poly layer for forming poly patterns P1, and a poly patterning process is preformed, in order to form the poly patterns P1 as shown in FIG. 10. In FIG. 11, spacers 51 are formed on the side walls of the poly patterns P1, and a fin side wall pull back (FSWPB) process is performed to pull back the dummy oxide layer O3 as shown in FIG. 10. In addition, a source/drain (S/D) epi process is performed to form helmet-shaped structures H2 on the S/D.

Figure 13:
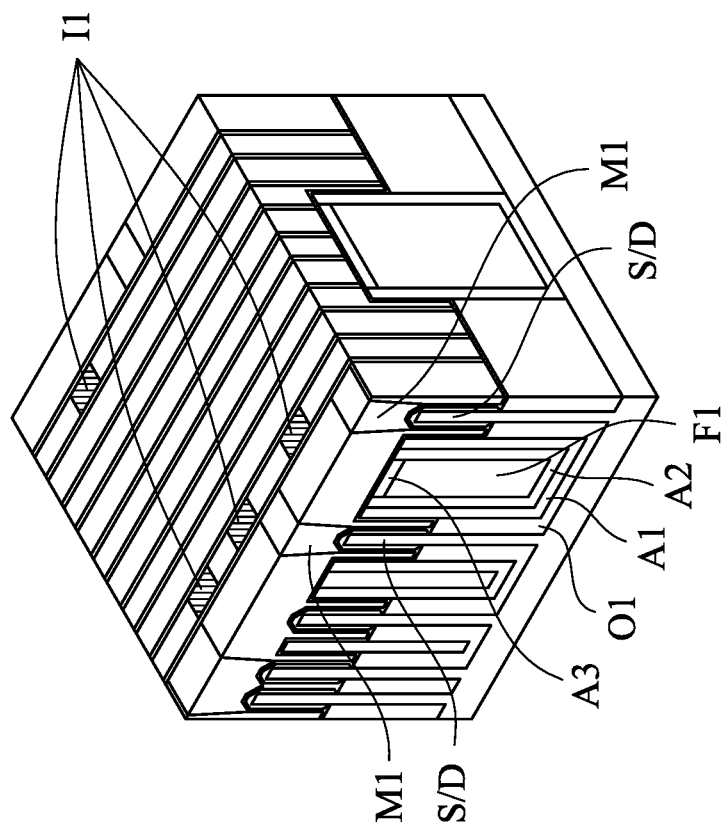
Figure 12:
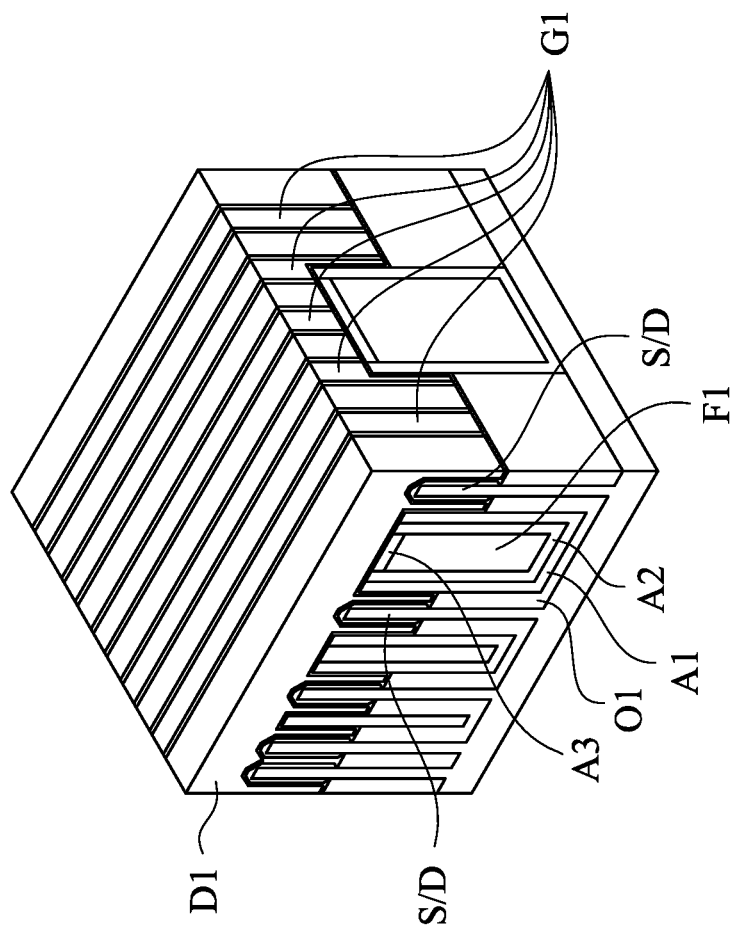

As illustratively shown in FIG. 12, a dielectric layer D1 is disposed on the structure as shown in FIG. 11. Subsequently, a CMP process is performed to remove the photo resists R1, the hard masks H1, and the upper portion of the dielectric layer D1. In addition, a replacement polysilicon gate loop process is performed to replace the poly patterns P1 in FIG. 11 and form metal gates G1 in FIG. 12. In FIG. 13, a cut metal gate (CMG) process is performed to cut a part of the metal gates, and form gate isolations I1. Subsequently, an S/D contact formation process is performed to form S/D contacts M1. In some embodiments, the S/D contact formation process is also referred to as an MD formation process.

Figure 14:
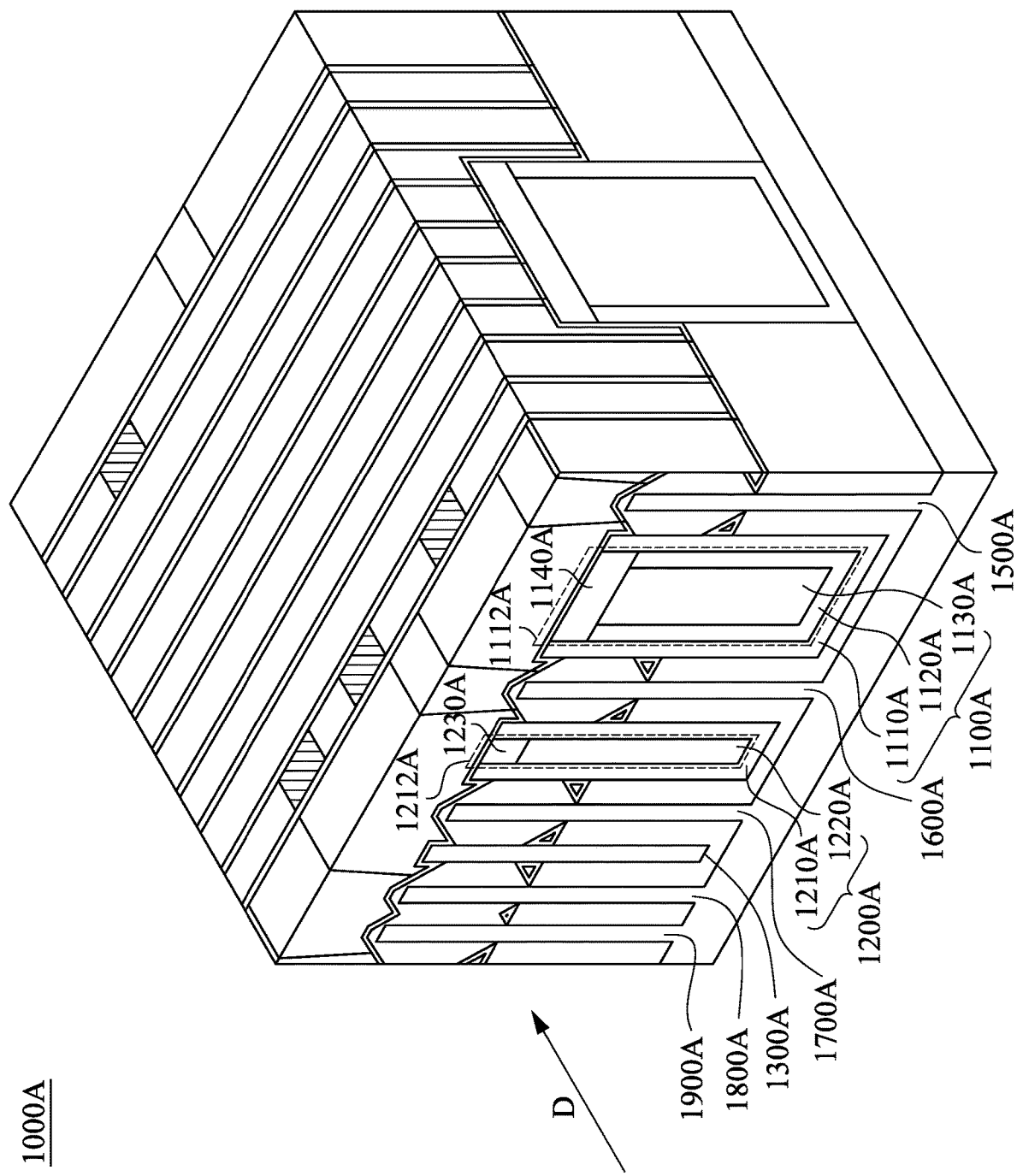
FIG. 14 is a schematic diagram of a semiconductor device, in accordance with some other embodiments of the present disclosure.
Figure 15:
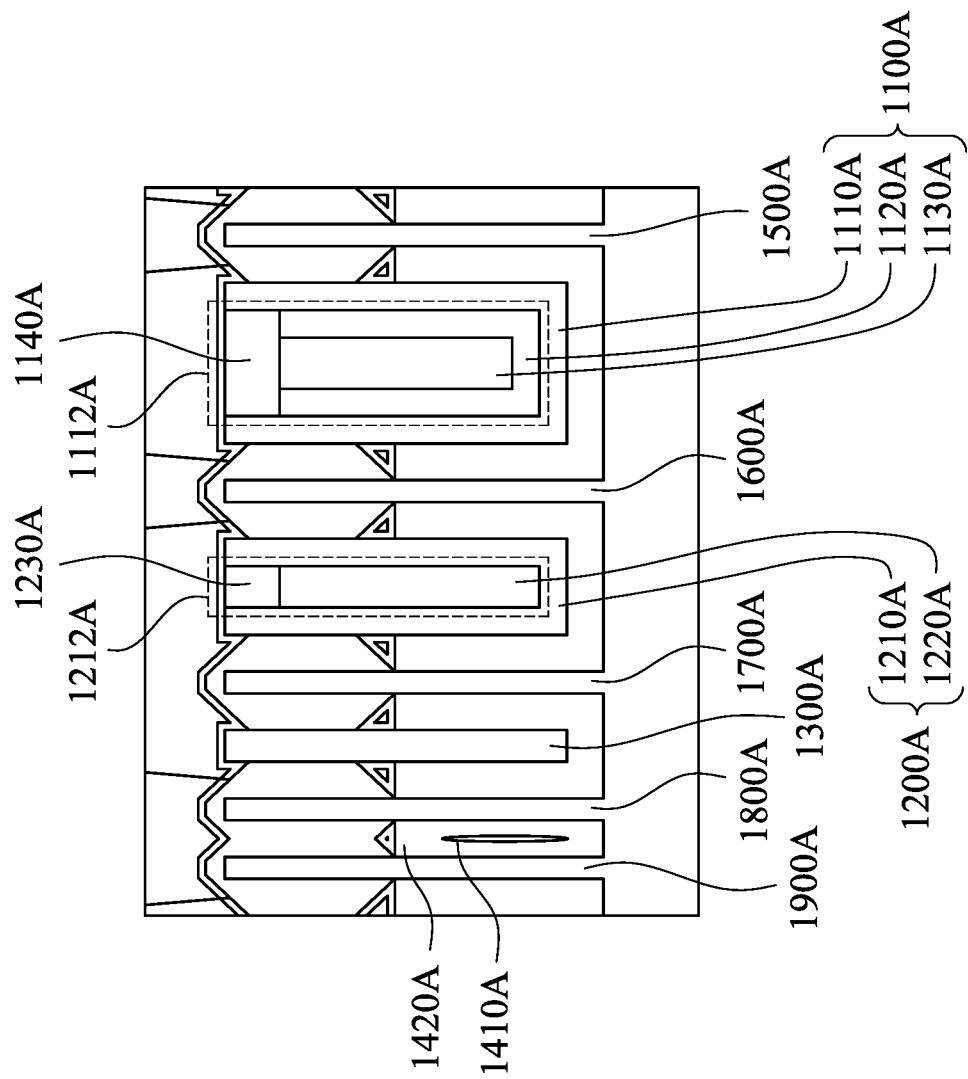
FIGS. 15-17 are front views of the semiconductor device in FIG. 14, in accordance with some embodiments of the present disclosure.

Reference is made to FIGS. 14, 15. FIG. 14 is a schematic diagram of a semiconductor device 1000A, in accordance with some embodiments. FIG. 15 is a front view of the semiconductor device 1000A in FIG. 14 from direction D, in accordance with some embodiments of the present disclosure.

As illustratively shown in FIGS. 14, 15, the semiconductor device 1000A includes a first isolation region 1100A, a second isolation region 1200A, and at least one fin (i.e., a fin 1600A). The first isolation region 1100A includes a first ALD layer 1110A, a second ALD layer 1120A, a FCVD layer 1130A, and a deposition layer 1140A. The first ALD layer 1110A includes a first trench 1112A. The second ALD layer 1120A is formed in the first trench 1112A of the first ALD layer 1110A. The FCVD layer 1130A is formed in the first trench 1112A of the first ALD layer 1110A and on the second ALD layer 1120A. In various embodiments, the plurality of isolation regions 1100A, 1200A are used as dummy fins.

For further illustration in FIGS. 14, 15, the second isolation region 1200A includes a third ALD layer 1210A and a fourth ALD layer 1220A. The third ALD layer 1210A includes a second trench 1212A. The fourth ALD layer 1220A is formed in the second trench 1212A of the third ALD layer 1210A. The fin 1600A is arranged between the first isolation region 1100A and the second isolation region 1200A.

In some embodiments, the deposition layer 1140A is formed in the first trench 1112A of the first ALD layer 1110A. In various embodiments, the deposition layer 1140A is in contact with the first ALD layer 1110A, the second ALD layer 1120A, and the FCVD layer 1130A.

In various embodiments, the deposition layer 1140A is an ALD layer. In some embodiments, the second isolation region 1200A includes a fifth ALD layer 1230A, and the fifth ALD layer 1230A is formed in the second trench 1212A and on the fourth ALD layer 1220A.

In various embodiments, the materials of the first ALD layer 1110A and the third ALD layer 1140A are selected from a group consisting of SiOC, SiOCN, and metal oxide such as HfO2, ZrO2. The material of the second ALD layer 1120A is selected from a group consisting of SiN, SiCN, and SiOCN. The materials of the ALD layers described above are given for illustrative purposes. Various materials of the ALD layers are within the contemplated scope of the present disclosure.

As illustratively shown in FIG. 15, a void 1410A is formed between the fins 1800A, 1900A of the semiconductor device 1000A. The void 1410A is formed during the spacer 1420A being merged because the fins 1800A, 1900A are too close to each other. Explained in another way, voids or seams tend to be formed in dense fins such as fins 1800A, 1900A.

Figure 16:
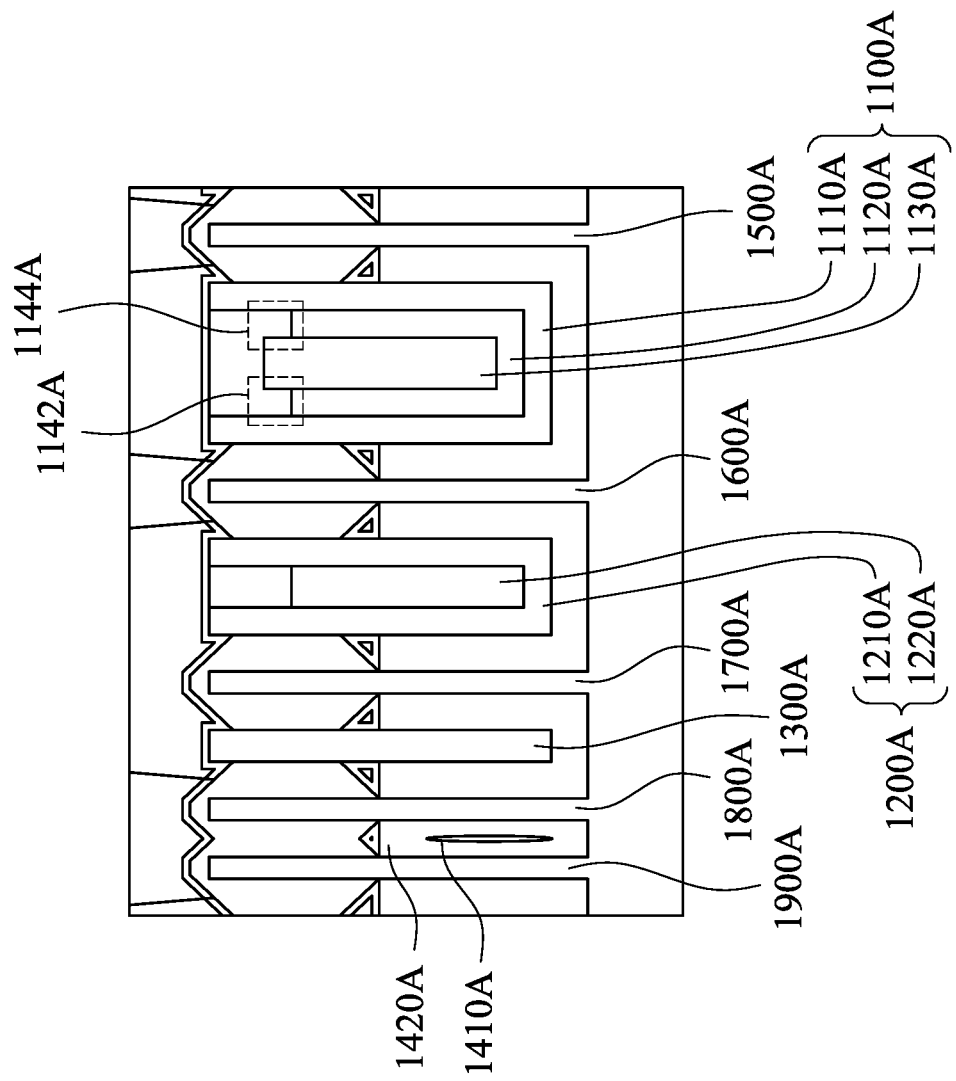

FIG. 16 is a front view of the semiconductor device 1000A in FIG. 14 from direction D, in accordance with some embodiments of the present disclosure. Compared with the semiconductor device 1000A in FIG. 15, the deposition layer 1140A of the semiconductor device 1000A herein is different. As illustratively shown in FIG. 16, the deposition layer 1140A includes bumps 1142A, 1144A. The bump 1142A is disposed at the left side of the deposition layer 1140A, and the bump 1144A is disposed at the right side of the deposition layer 1140A. The bumps 1142A, 1144A all extend beyond the button of the deposition layer 1140A.

Figure 17:
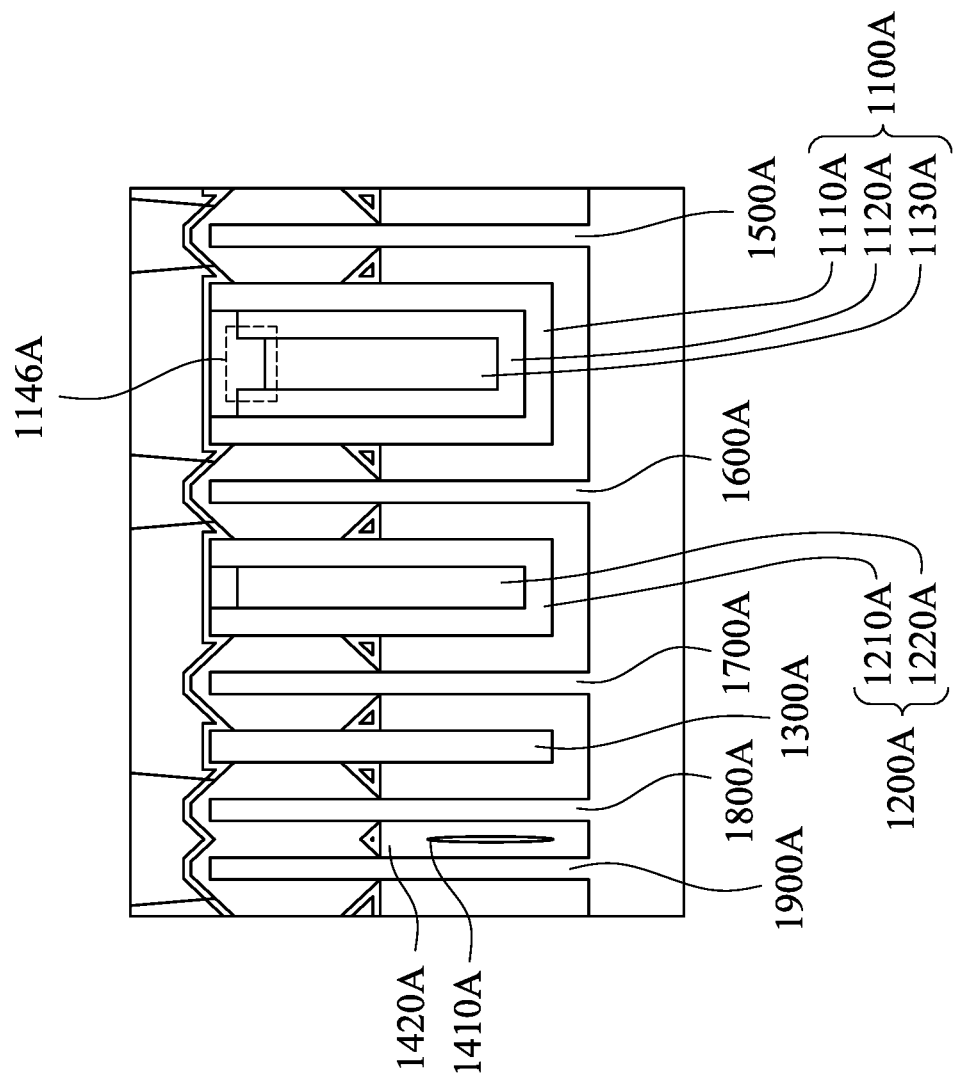
Figure 19:
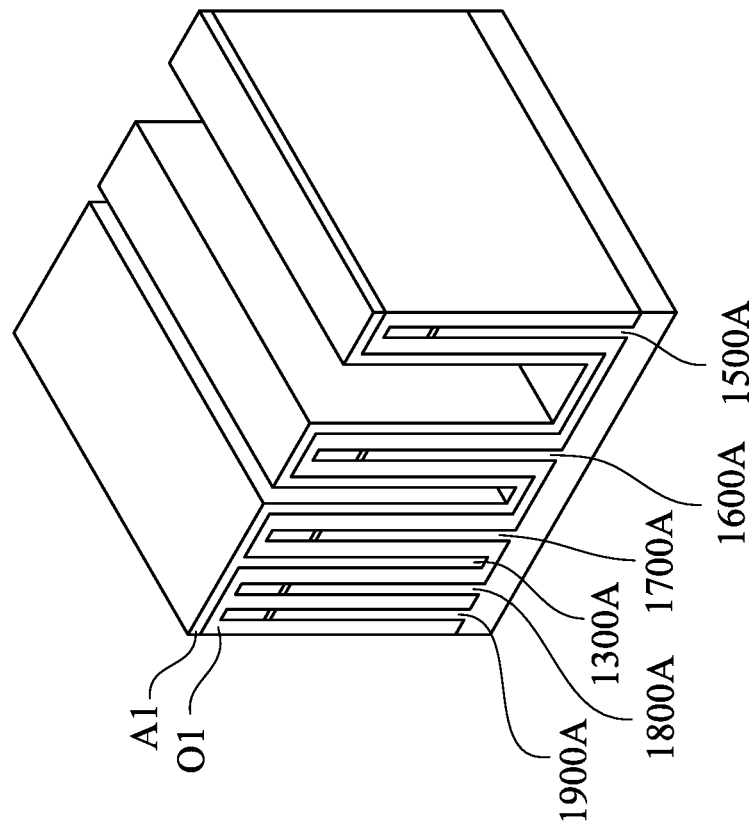
FIGS. 18-31 are process flows for manufacturing the semiconductor device in FIG. 14, in accordance with some embodiments of the present disclosure.
Figure 18:
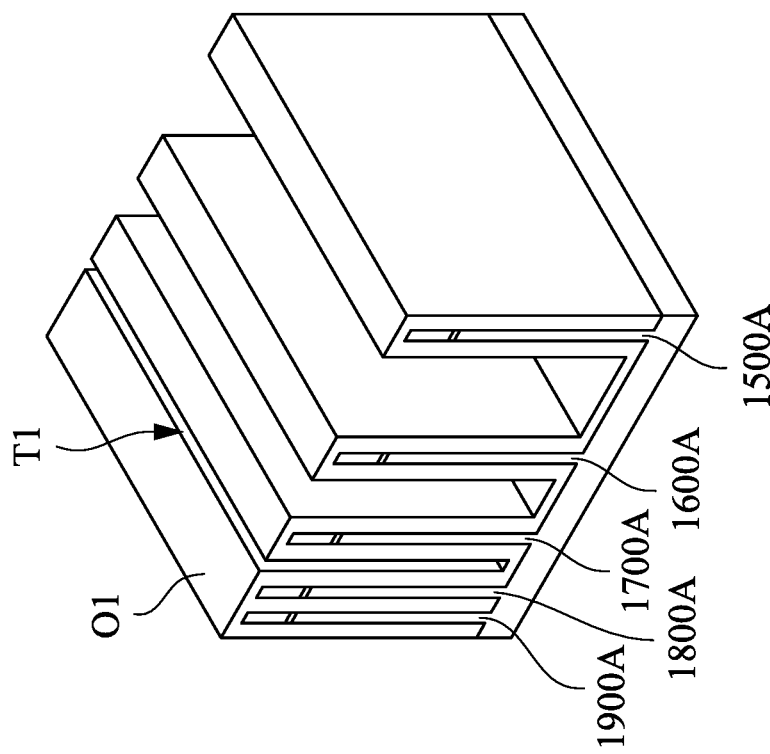
Figure 21:
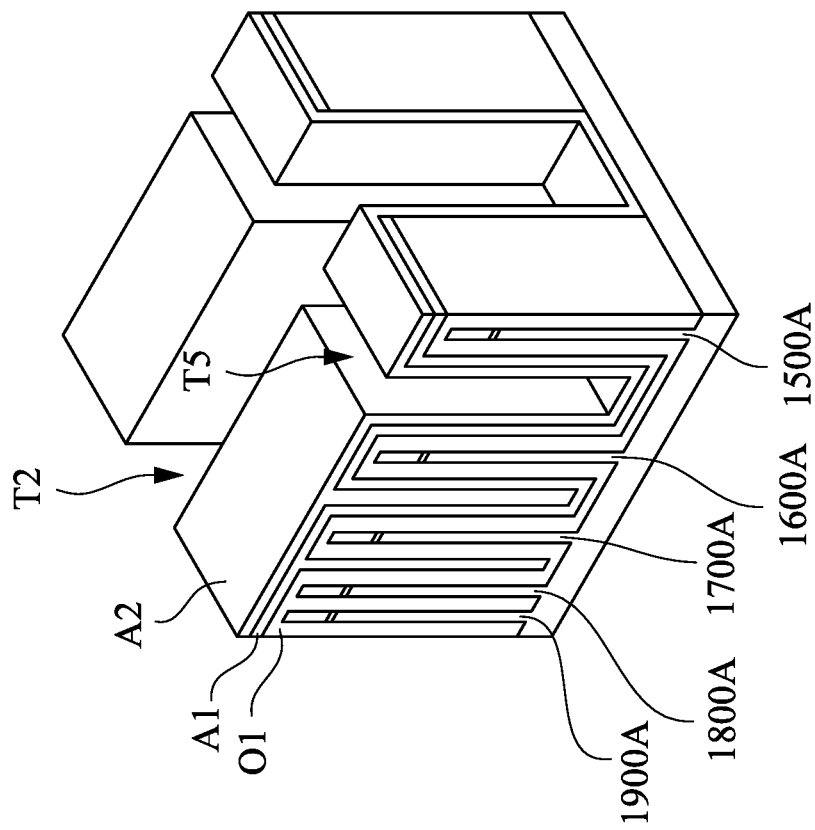
Figure 20:
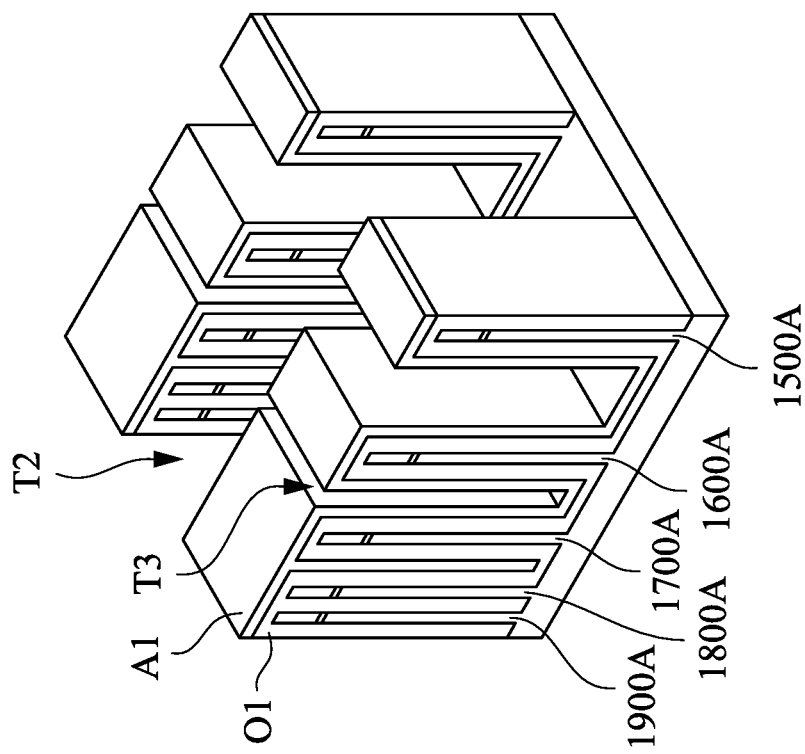

FIG. 17 is a front view of the semiconductor device 1000A in FIG. 14 from direction D, in accordance with some embodiments of the present disclosure. Compared with the semiconductor device 1000A in FIG. 15, the deposition layer 1140A of the semiconductor device 1000A herein is different. As illustratively shown in FIG. 17, the deposition layer 1140A includes a bump 1146A. The bump 1146A is disposed at the middle of the deposition layer 1140A, and extends beyond the button of the deposition layer 1140A.

FIGS. 18-31 are process flows for manufacturing the semiconductor device 1000A in FIG. 14, in accordance with some embodiments of the present disclosure.

As illustratively shown in FIGS. 18-22, since the processes thereof are similar to the processes in FIGS. 2-6, the detailed description regarding the processes is therefore omitted for the sake of brevity.

Figure 23:
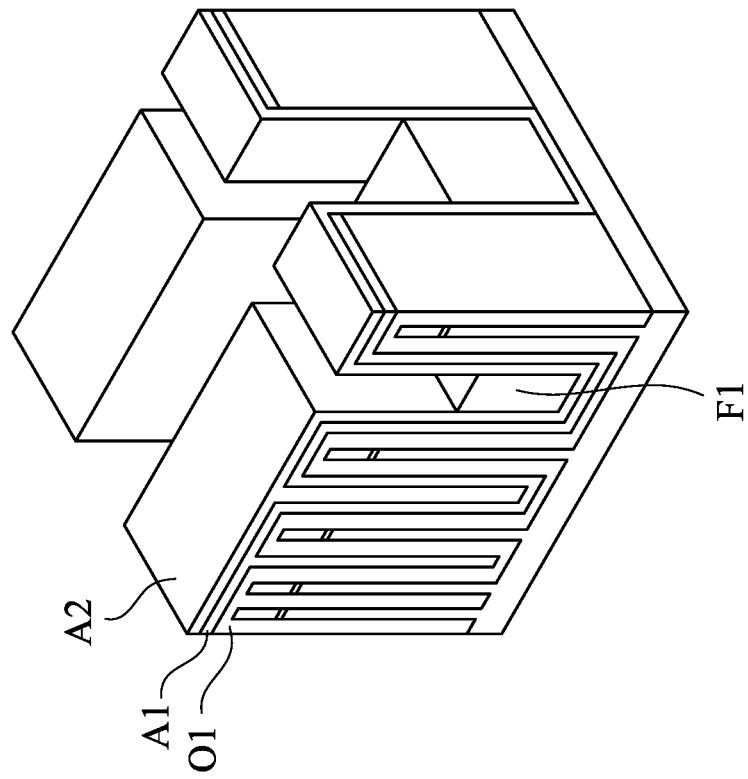
Figure 22:
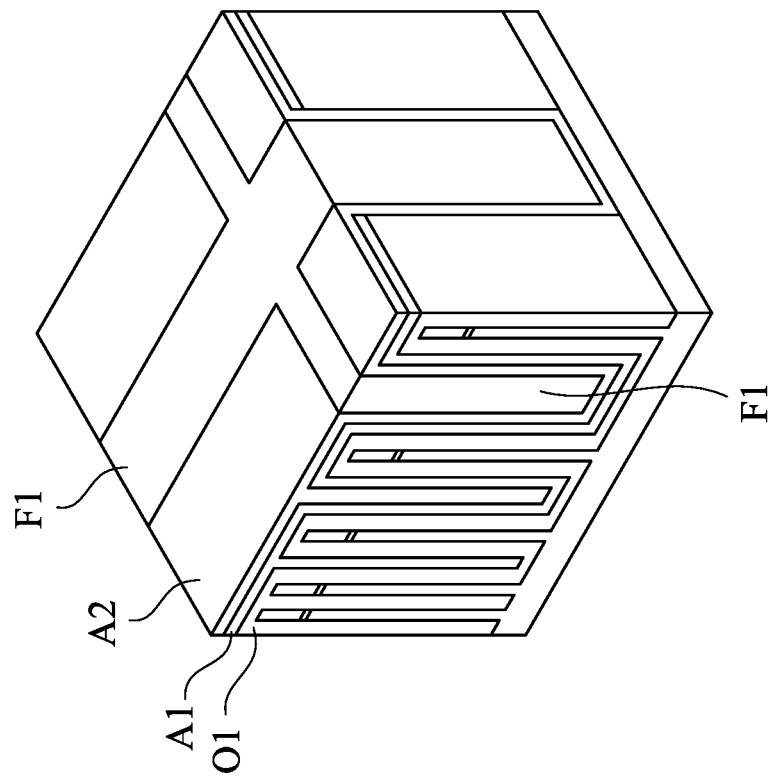
Figure 24:
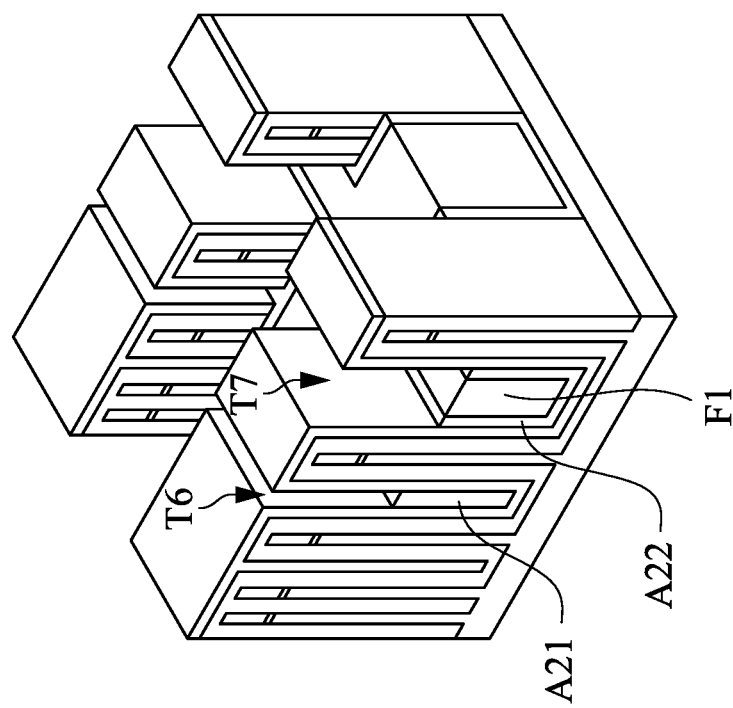

Reference is made to FIG. 23, an oxide recess process is preformed to recess the FCVD layer F1, and the upper portion of the FCVD layer F1 is removed. In FIG. 24, an oxide recess process is preformed to recess the ALD material A2. In some embodiments, the ALD material A2 is partially recessed, and part of ALD material A2 remain. For example, the ALD material A21 remains in the trench T6, and the ALD material A22 remains in the trench T7. In various embodiments, the height of the ALD material A22 is the same as that of the FCVD layer F1.

Figure 25:
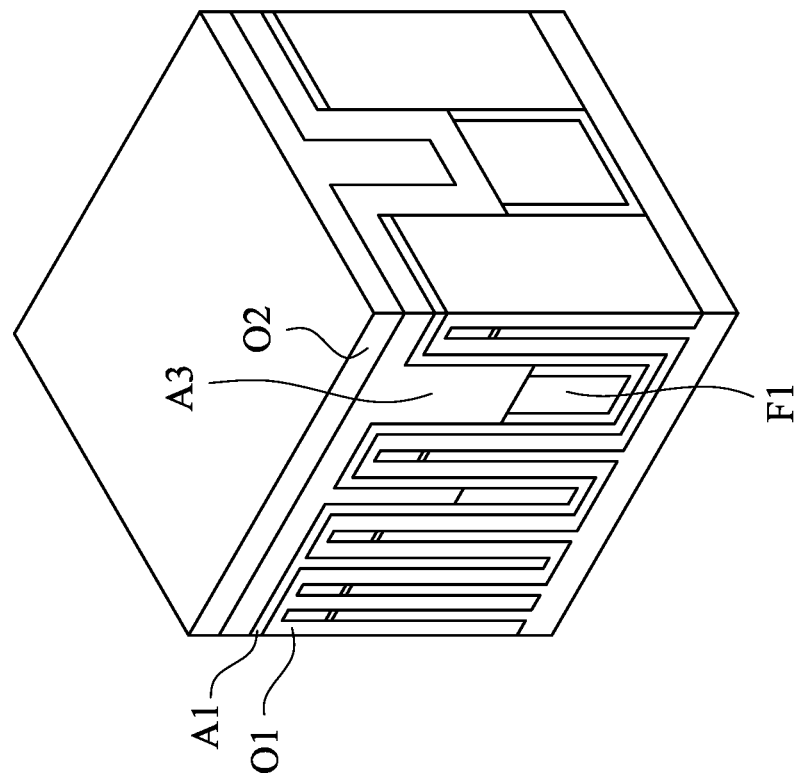
Figure 27:
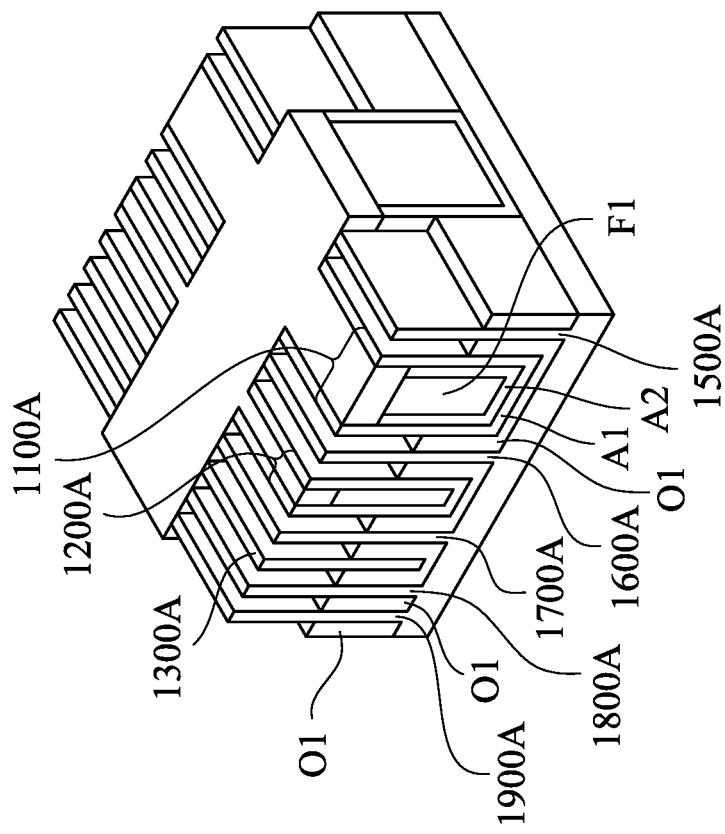
Figure 26:
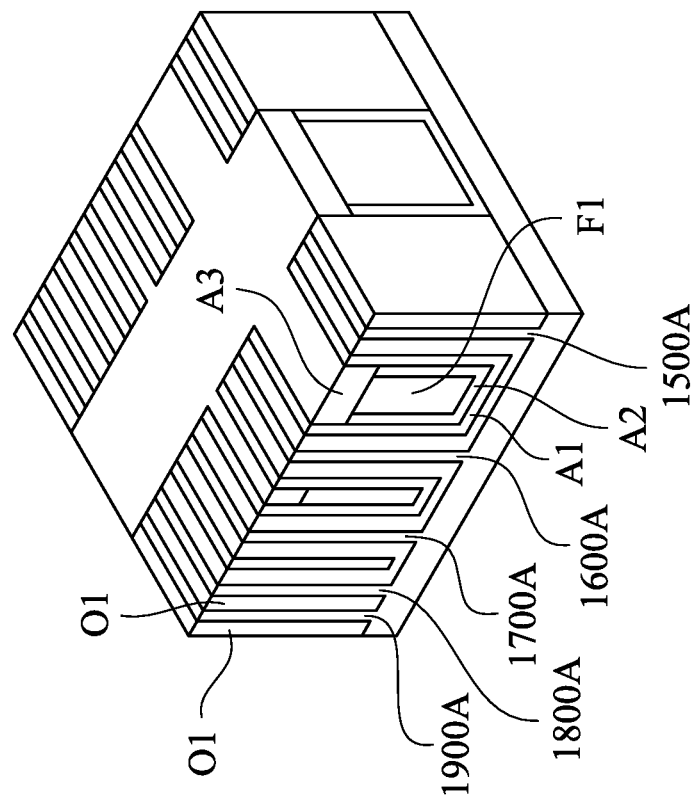
Figure 29:
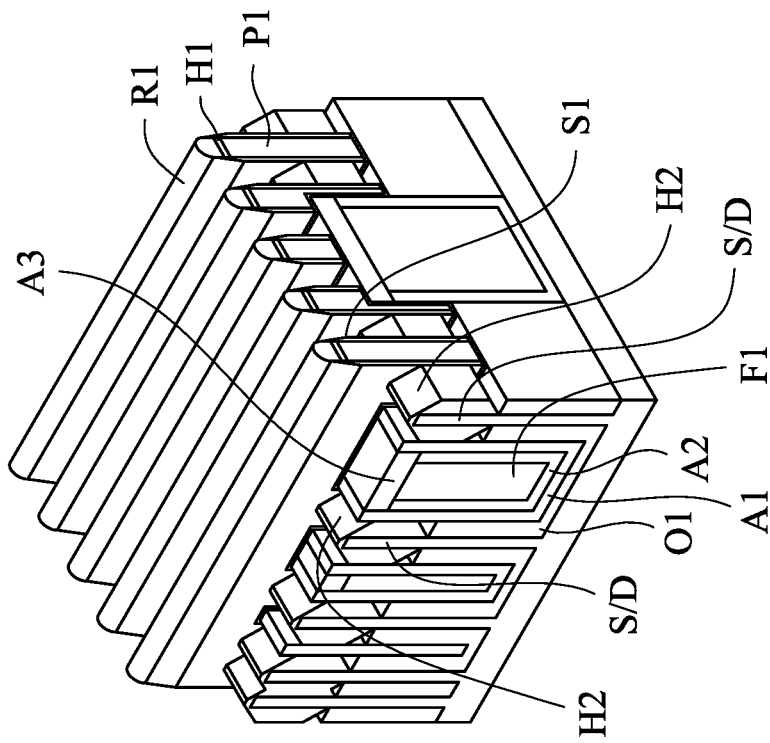
Figure 28:
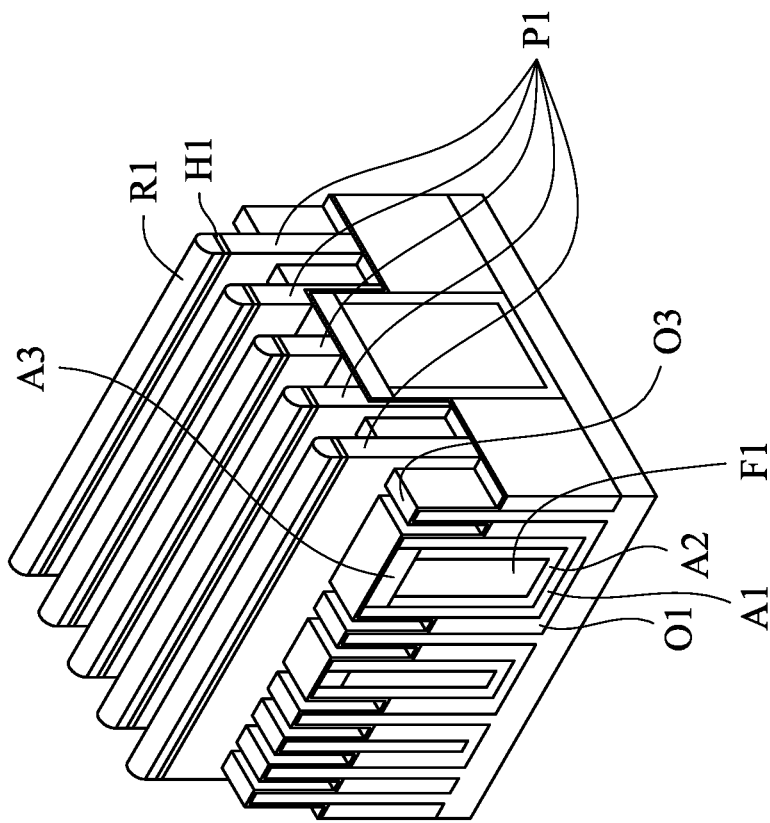
Figure 31:
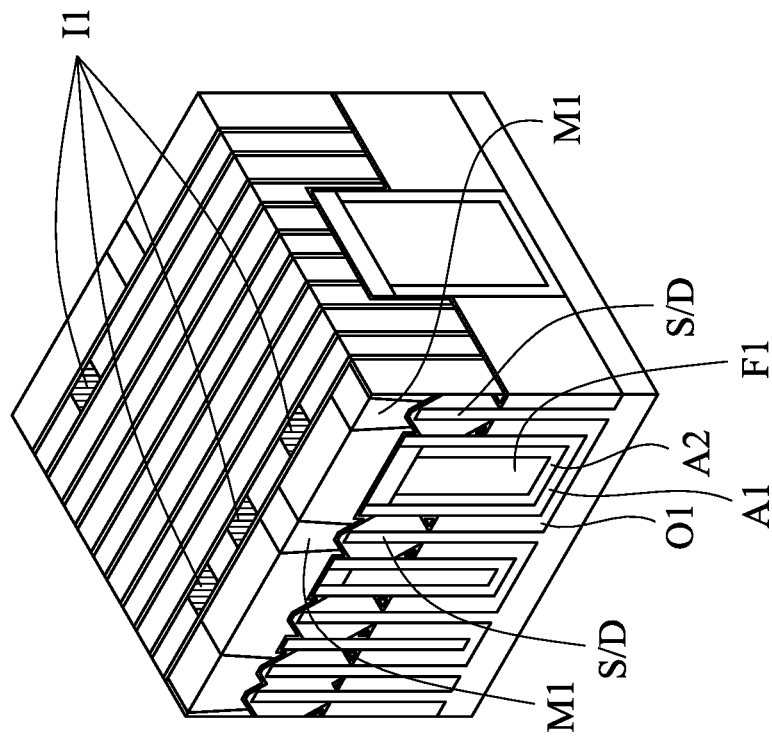
Figure 30:
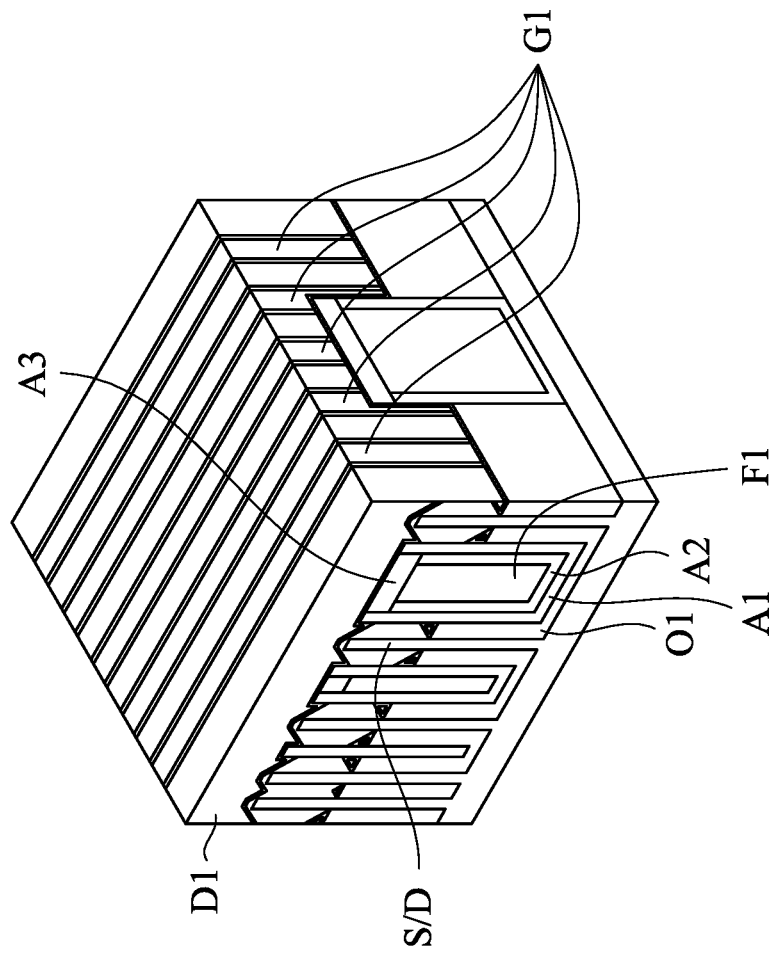

As illustratively shown in FIG. 25, an ALD material A3 is formed on the recessed structure as shown in FIG. 24. Subsequently, an oxide layer O2 is formed on the ALD material A3. In some embodiments, the oxide layer O2 is a plasma enhanced oxide (PEOX) layer. Reference is made to FIG. 26, a CMP process is performed. The oxide layer O2 is therefore removed, and the upper portions of the oxide layer O1, the ALD layers A1, A3 are also removed. Referring to FIG. 27, a STI recess is performed. The upper portion of the oxide layer O1 is removed, and the fin structures such as the fins 1500A-1900A and the isolation regions 1100A, 1200A, 1300A as dummy fins are therefore formed.

Reference is made to FIGS. 28-31, since the processes thereof are similar to the processes in FIGS. 10-13, the detailed description regarding the processes is therefore omitted for the sake of brevity.

Figure 32:
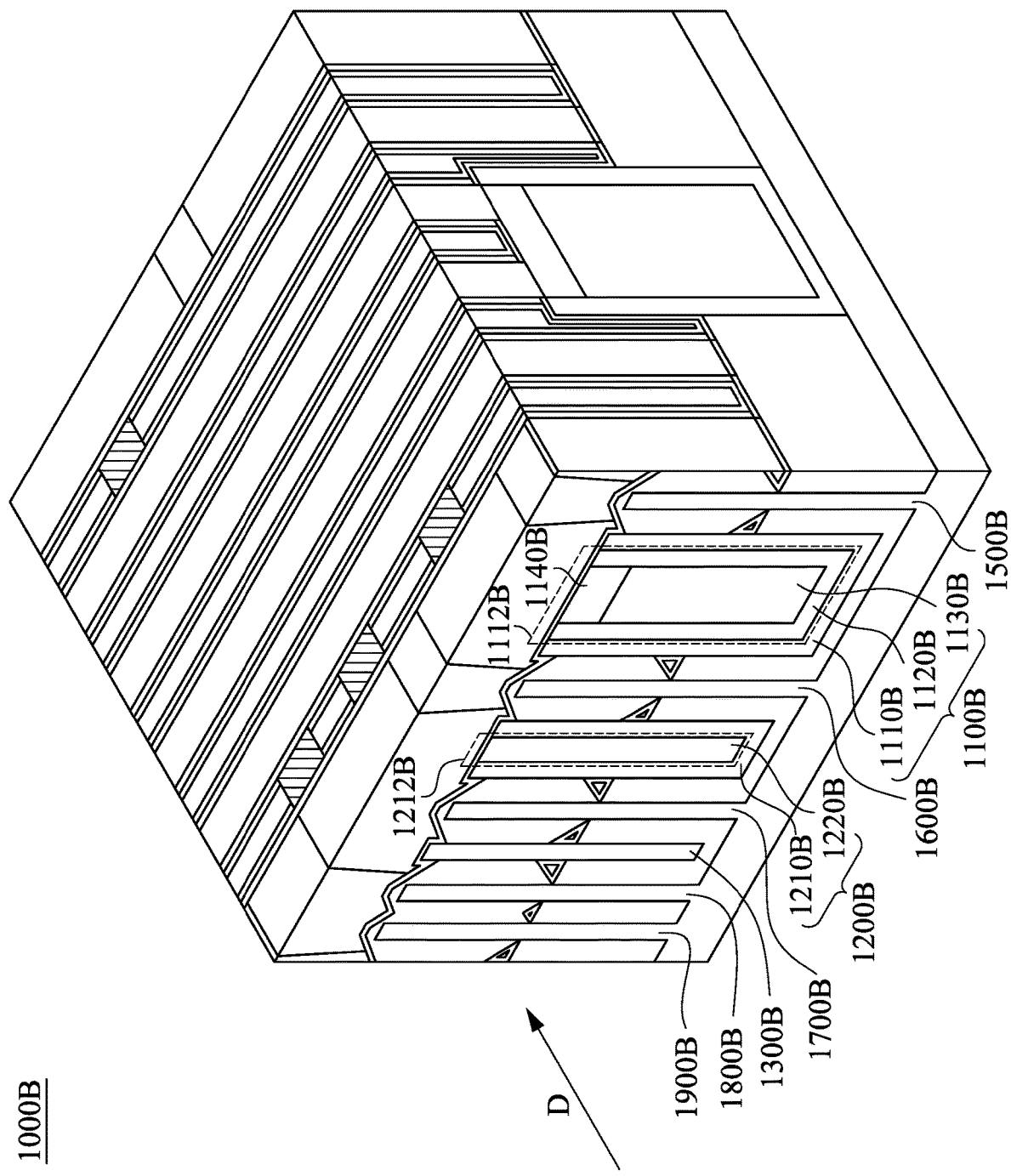
FIG. 32 is a schematic diagram of a semiconductor device, in accordance with various embodiments of the present disclosure.
Figure 33:
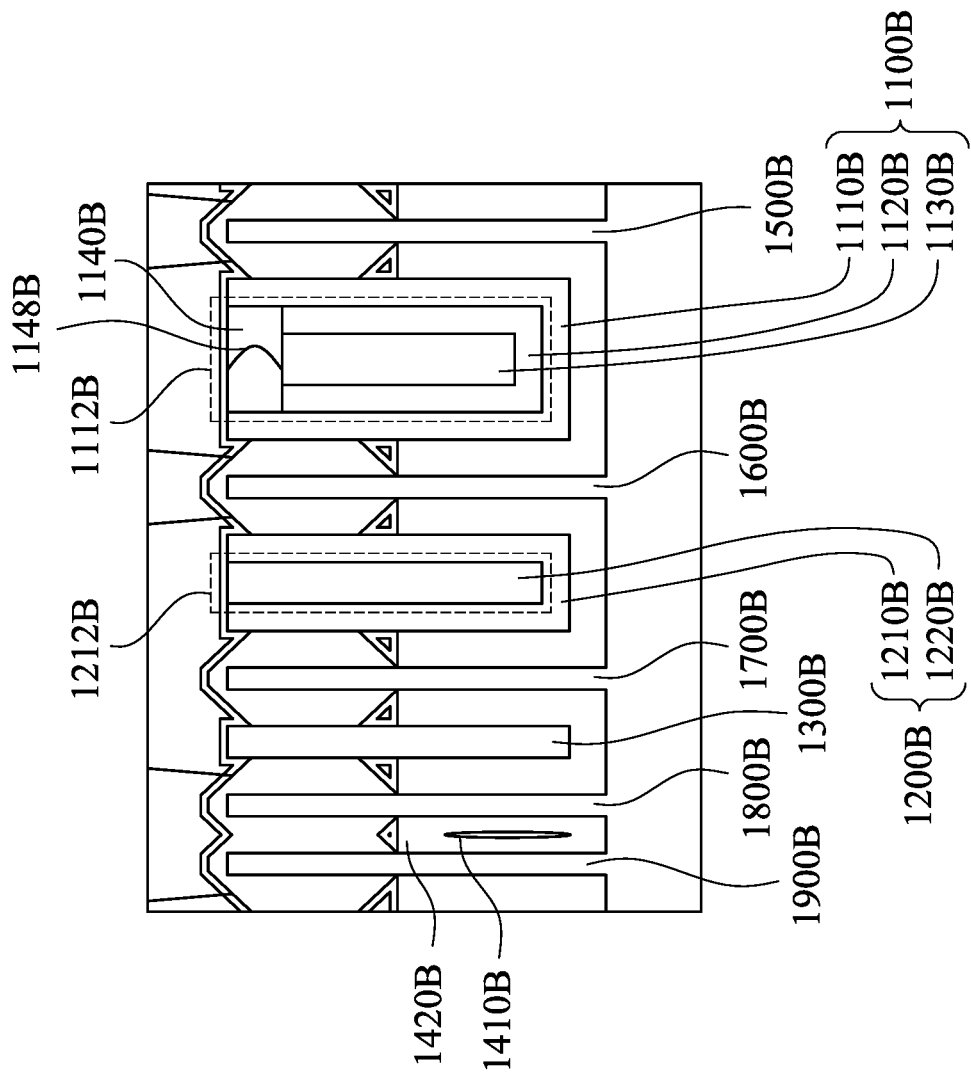
FIGS. 33-35 are front views of the semiconductor device in FIG. 32, in accordance with some embodiments of the present disclosure.

Reference is made to FIGS. 32, 33. FIG. 32 is a schematic diagram of a semiconductor device 1000B, in accordance with some embodiments. FIG. 33 is a front view of the semiconductor device 1000B in FIG. 32 from direction D, in accordance with some embodiments of the present disclosure.

Compared the semiconductor device 1000A in FIGS. 14, 15 with the semiconductor device 1000B in FIGS. 32, 33, the semiconductor device 1000A in FIGS. 14, 15 further includes the fifth ALD layer 1230A which is formed in the second trench 1212A and on the fourth ALD layer 1220A. In addition, the deposition layer 1140B of the semiconductor device 1000B in FIGS. 32, 33 is a FCVD layer rather than an ALD layer.

In some embodiments, the FCVD layer 1140B is implanted with impurity. In various embodiments, the FCVD layer 1140B is implanted with high dose impurity. The impurity is selected form a group consisting of Si, Ge, C, A1, and a combination thereof. The impurity is distributed in the FCVD layer 1140B in a gauss manner. In some embodiments, the materials of the first ALD layer 1110B, the third ALD layer 1210B, and the third isolation region 1300B are selected form a group consisting of SiOC, SiOCN, and metal oxide such as HfO2, ZrO2. The materials of the second ALD layer 1120B and the fourth ALD layer 1220B are selected from a group consisting of SiN, SiCN, and SiOCN. The impurity implanted in the FCVD layer 1140B and materials of the ALD layers described above are given for illustrative purposes. Various impurity and materials adopted in the FCVD layer and the ALD layers are within the contemplated scope of the present disclosure.

As illustratively shown in FIG. 33, a curve line 1148B represents a concentration distribution in the deposition layer 1140B of the semiconductor device 1000B. Referring to the curve line 1148B shown in FIG. 33, the middle part of the deposition layer 1140B has the highest concentration, and the concentration is decreased from the middle part to the edge of the deposition layer 1140B in a gauss manner.

Referring to FIG. 33, a void 1410B is formed between the fins 1800B, 1900B of the semiconductor device 1000B. The void 1410B is formed during the spacer 1420B being merged because the fins 1800B, 1900B are close to each other. Explained in another way, voids or seams tend to form in dense fins such as fins 1800B, 1900B.

In some approaches, poor quality of FCVD layers as a dummy fin would induce loss of the dummy fins during wet or dry processes. Compared to the approaches above, in the present disclosure, the FCVD layer 1140B is implanted with high dose impurity such as Si, Ge, C, A1, which largely changes material property of the FCVD layer 1140B as a dummy fin so as to increases wet clean and STI recess certas resistance.

Figure 34:
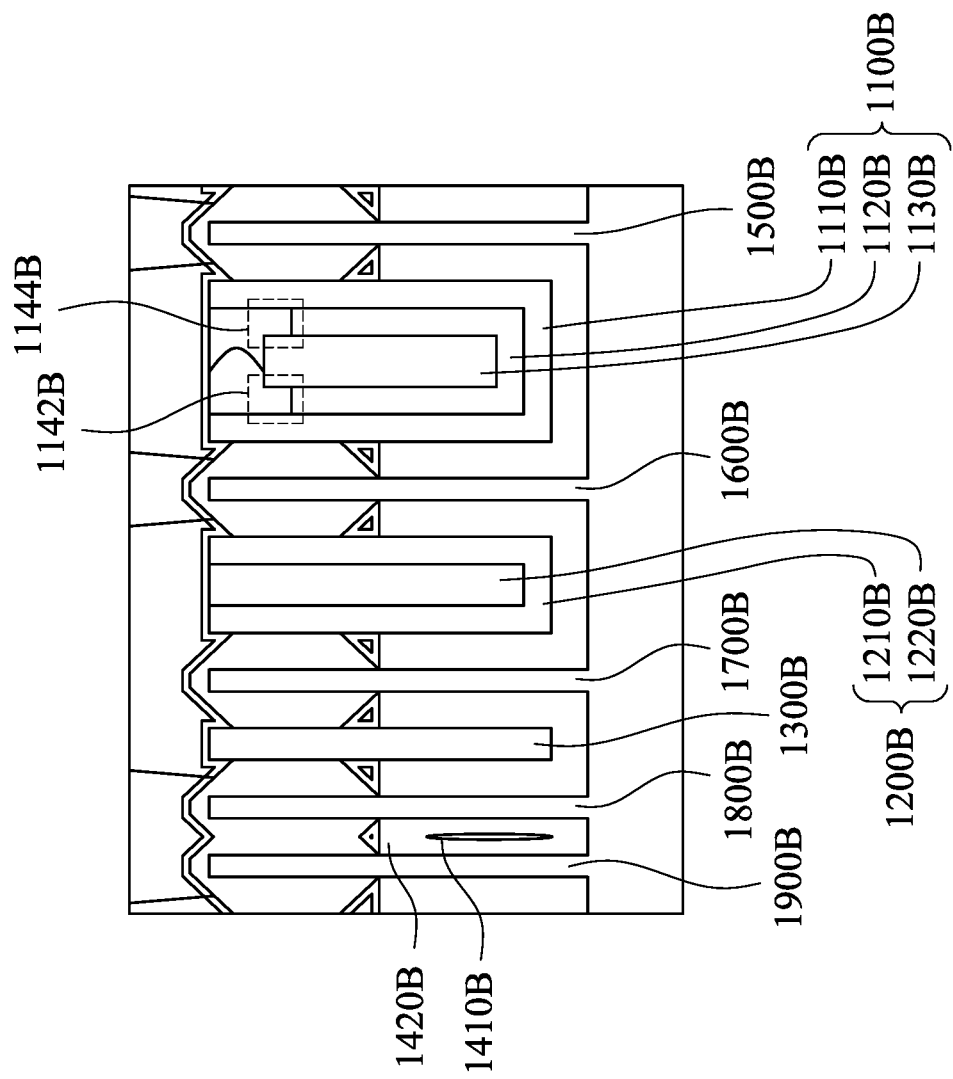

FIG. 34 is a front view of the semiconductor device 1000B in FIG. 32 from direction D, in accordance with some embodiments of the present disclosure. Compared with the semiconductor device 1000B in FIG. 33, the deposition layer 1140B of the semiconductor device 1000B herein is different. As illustratively shown in FIG. 34, the deposition layer 1140B includes bumps 1142B, 1144B. The bump 1142B is disposed at the left side of the deposition layer 1140B, and the bump 1144B is disposed at the right side of the deposition layer 1140B. The bumps 1142B, 1144B all extend beyond the button of the deposition layer 1140B.

Figure 35:
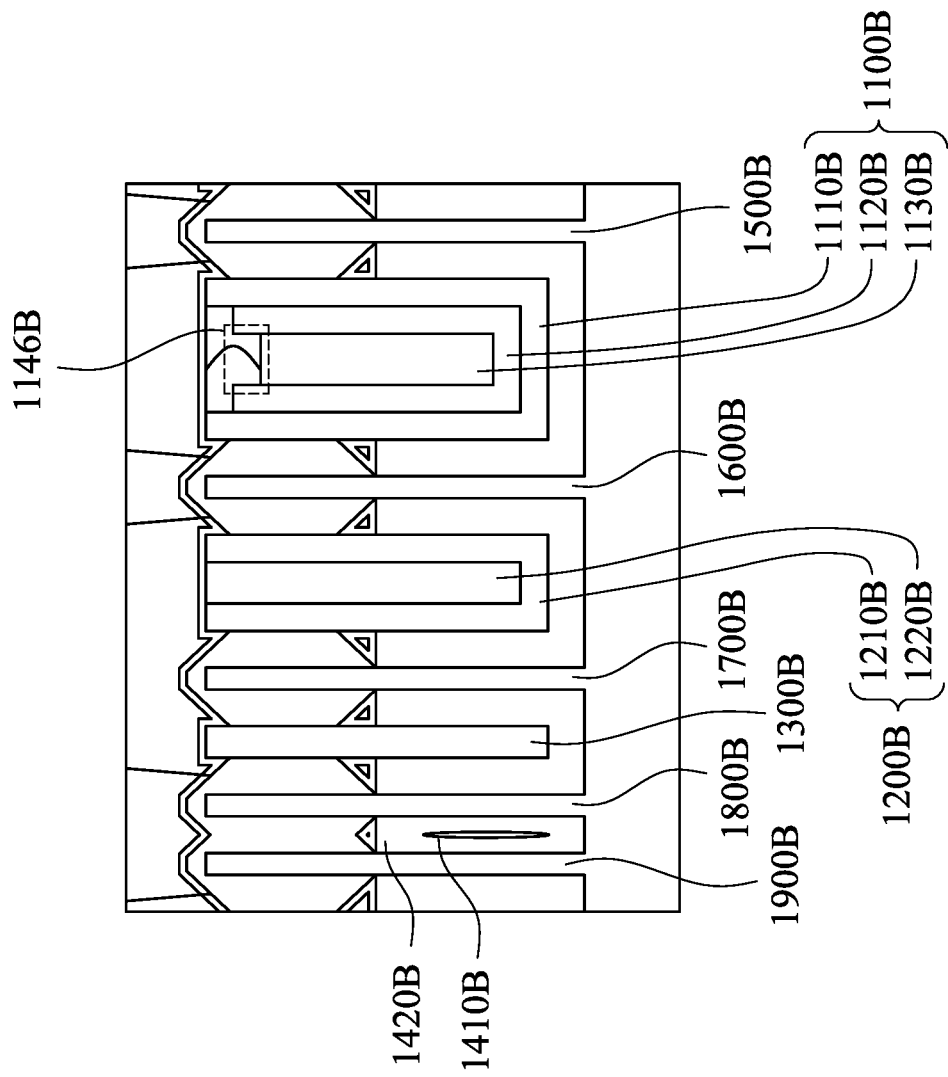
Figure 37:
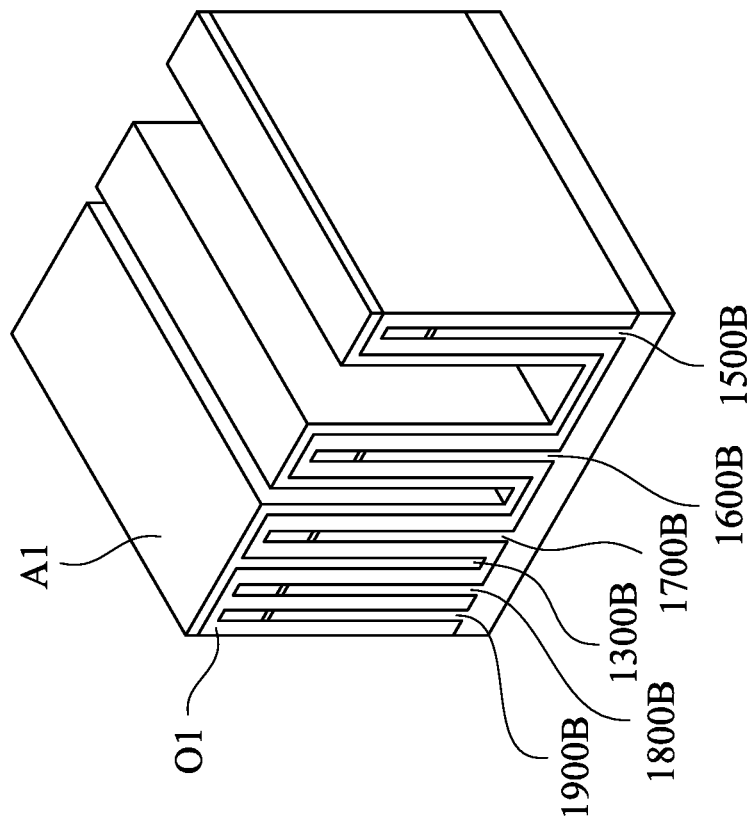
Figure 36:
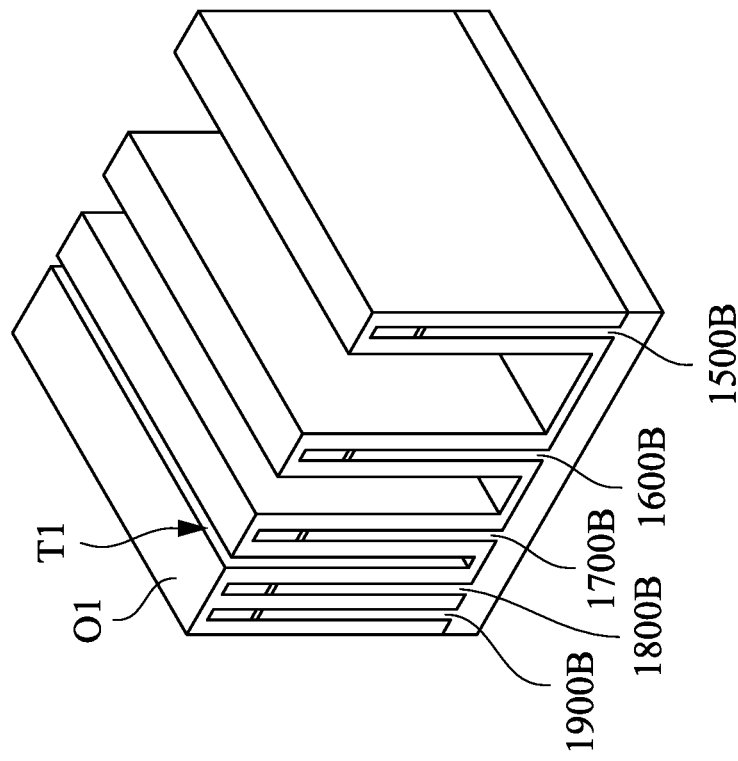
Figure 39:
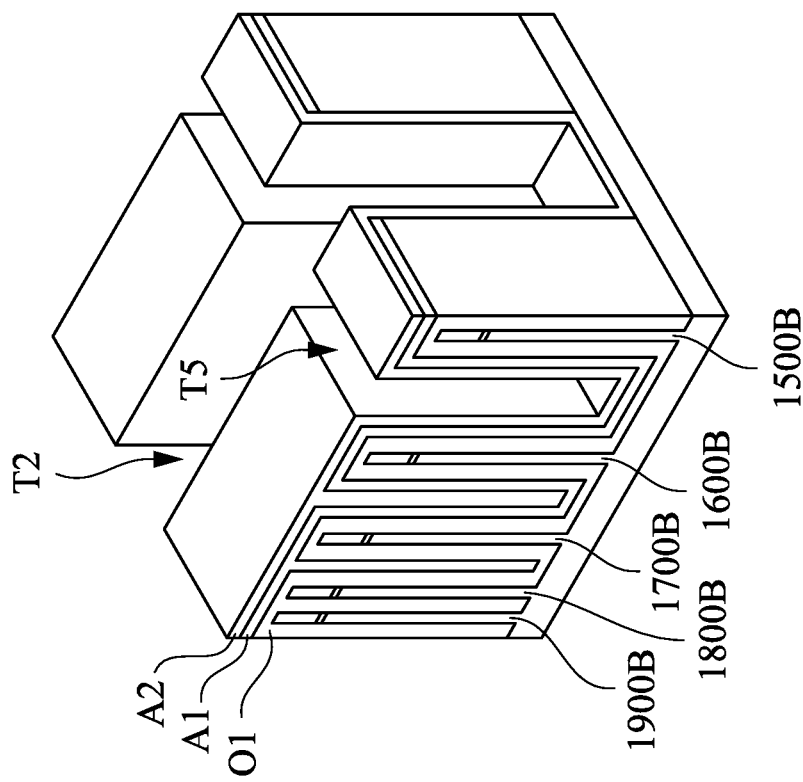
Figure 38:
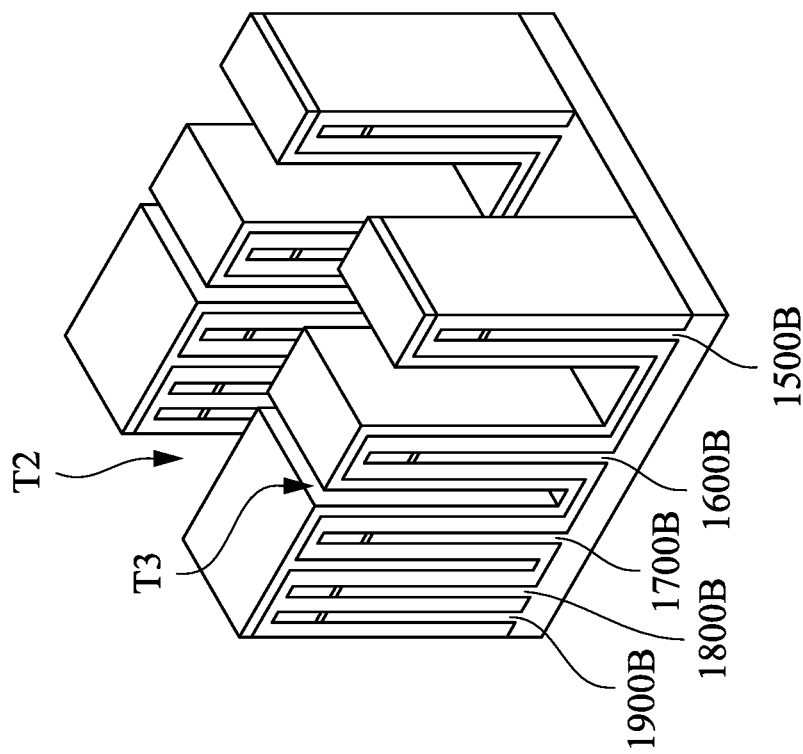
Figure 41:
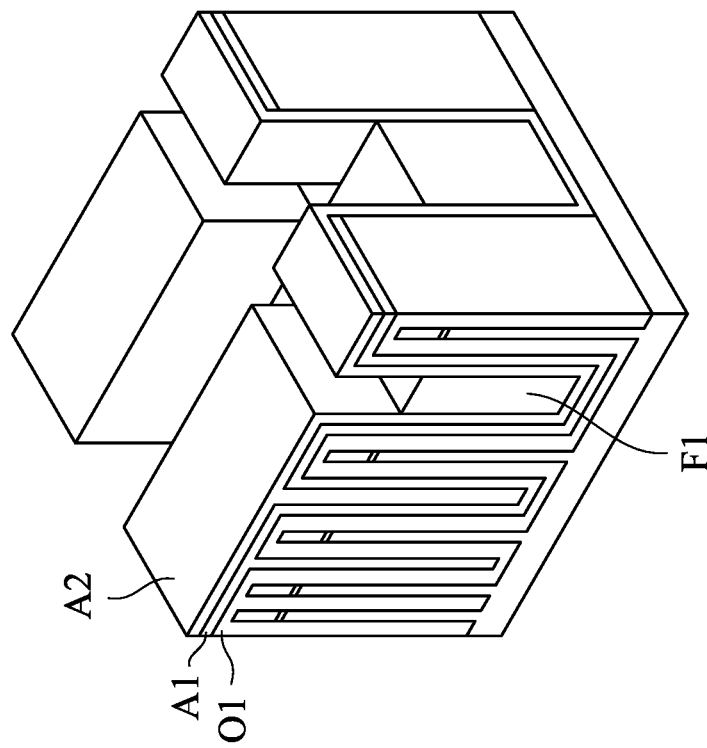
Figure 40:
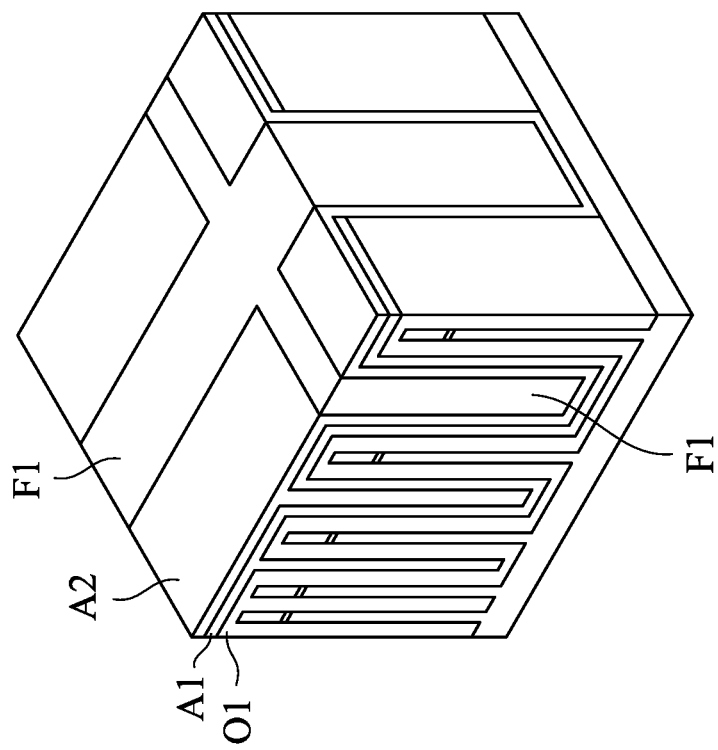
Figure 43:
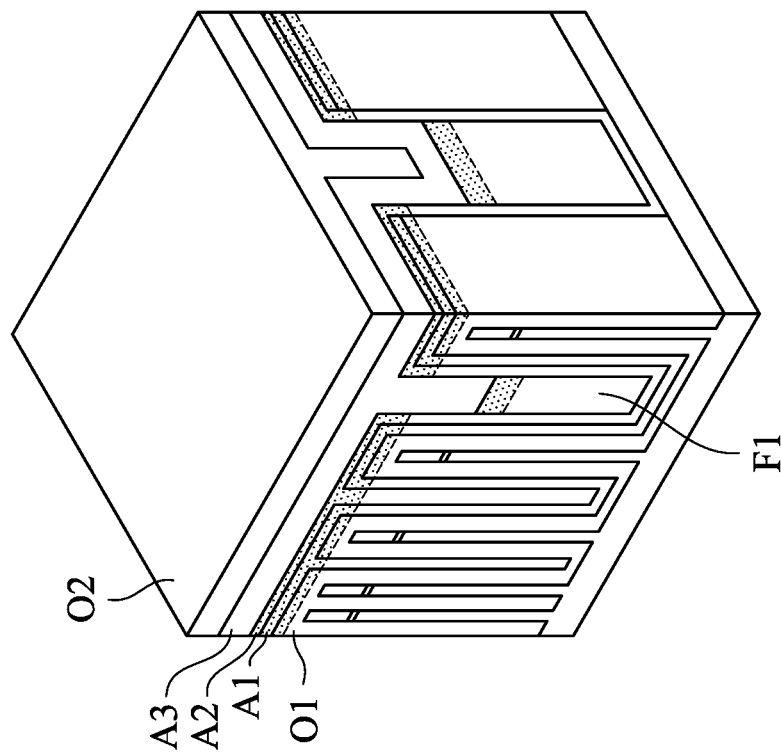

FIG. 35 is a front view of the semiconductor device 1000B in FIG. 32 from direction D, in accordance with some embodiments of the present disclosure. Compared with the semiconductor device 1000B in FIG. 33, the deposition layer 1140B of the semiconductor device 1000B herein is different. As illustratively shown in FIG. 35, the deposition layer 1140B includes a bump 1146B. The bump 1146B is disposed at the middle of the deposition layer 1140B and extends beyond the button of the deposition layer 1140B.

FIGS. 36-49 are process flows for manufacturing the semiconductor device 1000B in FIG. 32, in accordance with some embodiments of the present disclosure.

As illustratively shown in FIGS. 36-41, since the processes thereof are similar to the processes in FIGS. 18-23, the detailed description regarding the processes is therefore omitted for the sake of brevity.

Figure 42:
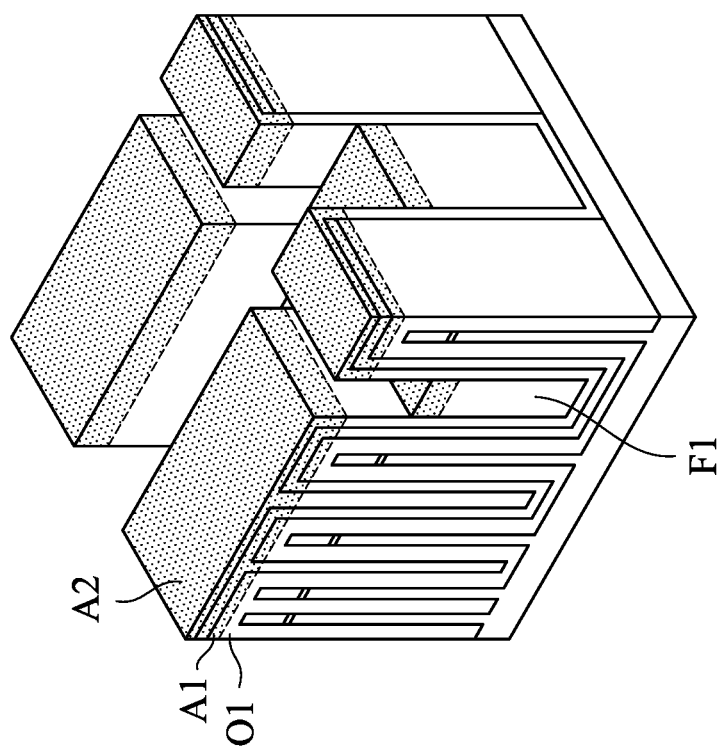
Figure 45:
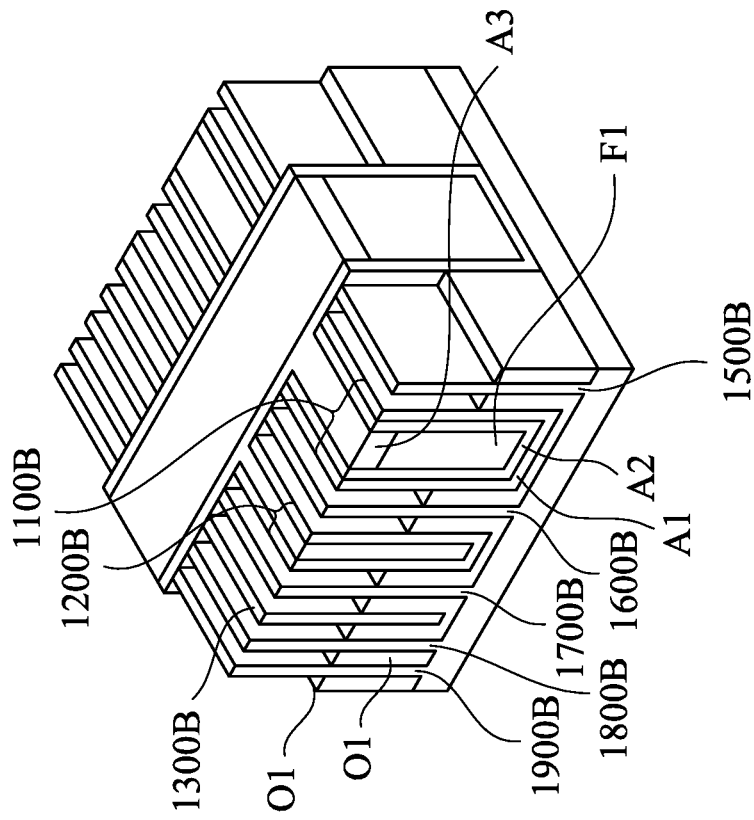
Figure 44:
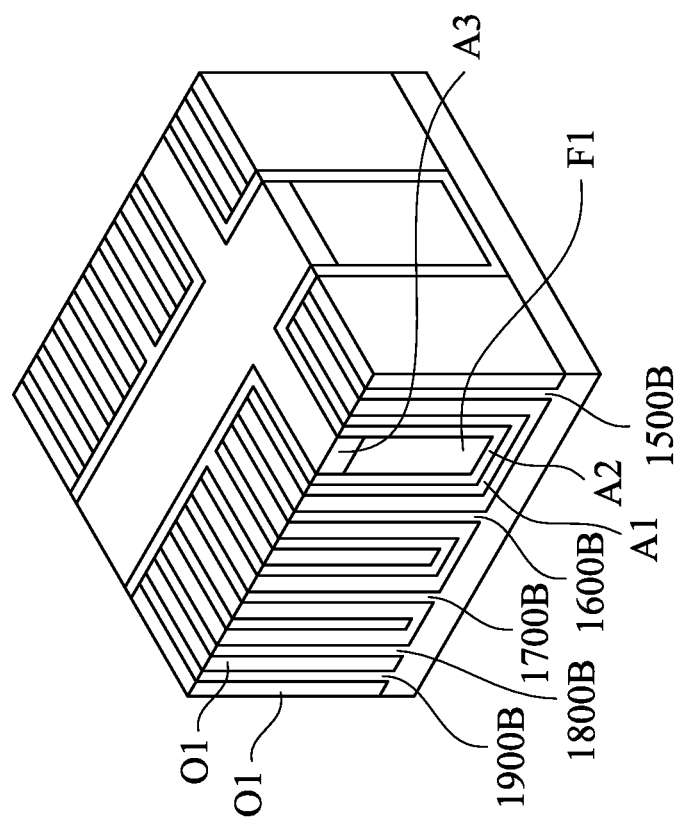
Figure 47:
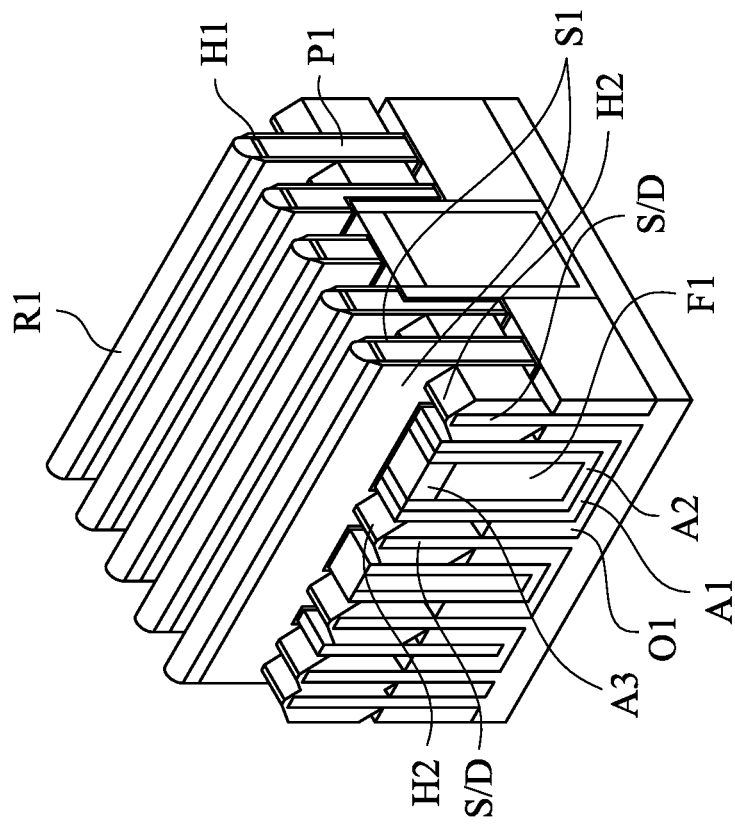
Figure 46:
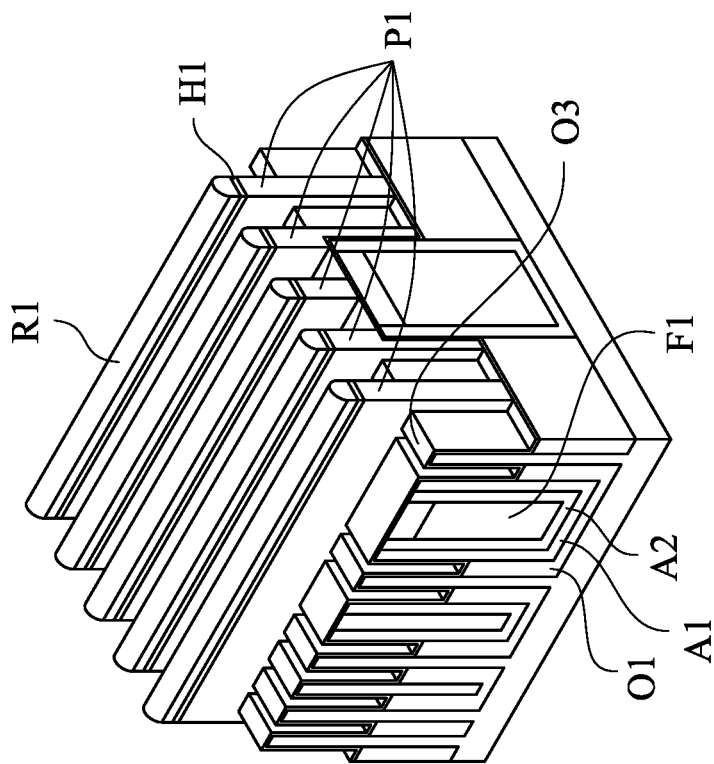

Reference is made to FIG. 42, the upper portions of the ALD layers A1, A2, the oxide layer O1, and the FCVD layer F1 are implanted with high dose impurity. In some embodiments, the impurity is selected form a group consisting of Si, Ge, C, A1, and a combination thereof. As illustratively shown in FIG. 43, an ALD material A3 is disposed on the implanted structure as shown in FIG. 42, and an oxide layer O2 is formed on the ALD material A3 thereafter.

As illustratively shown in FIGS. 44-49, since the processes thereof are similar to the processes in FIGS. 26-31, the detailed description regarding the processes is therefore omitted for the sake of brevity.

Figure 50:
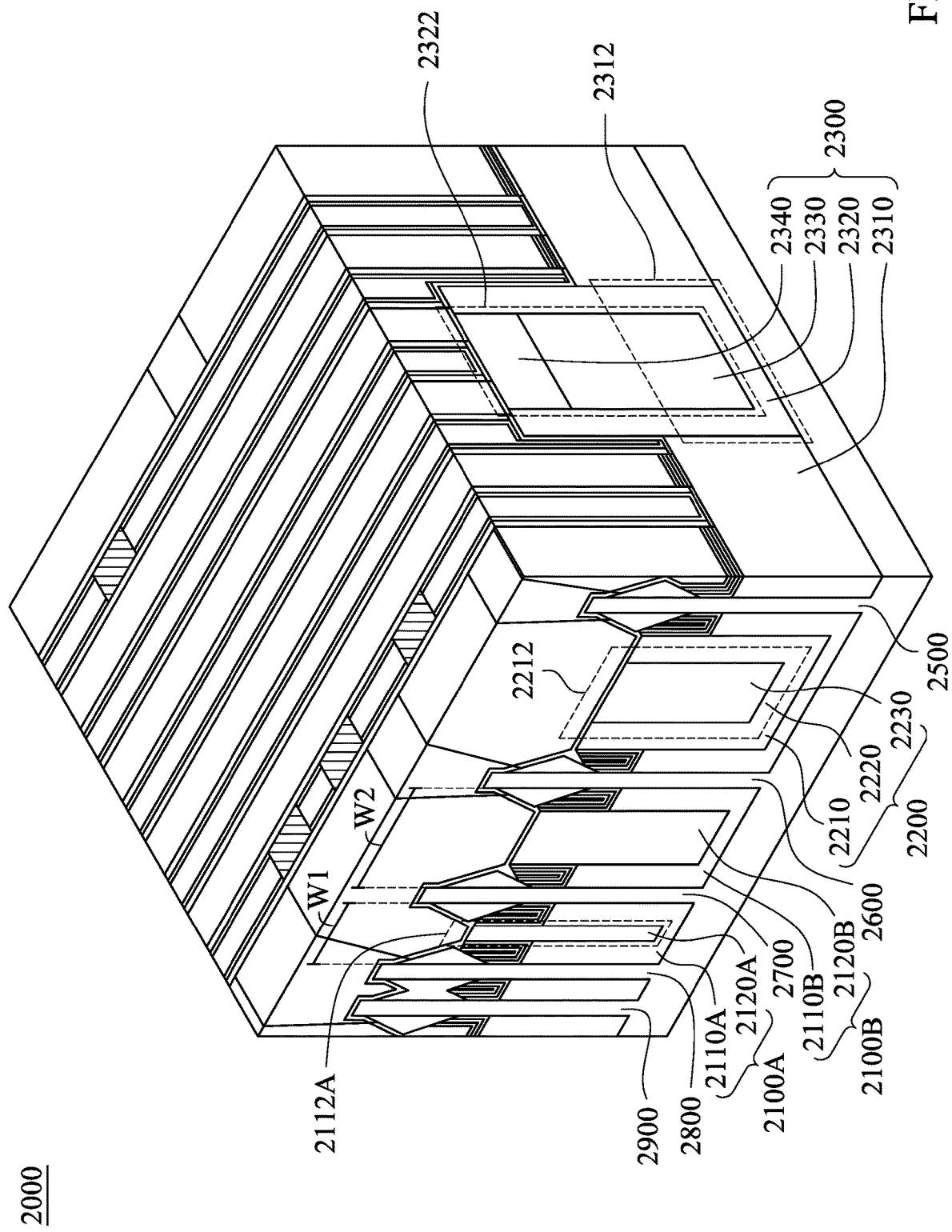
FIG. 50 is a schematic diagram of a semiconductor device, in accordance with alternative embodiments of the present disclosure.

Reference is made to FIG. 50. FIG. 50 is a schematic diagram of a semiconductor device 2000, in accordance with some embodiments.

As illustratively shown in FIG. 50, the semiconductor device 2000 includes a plurality of fins 2500, 2600, 2700, 2800, 2900, and a plurality of isolation regions 2100A, 2100B, 2200, 2300. Each of the plurality of isolation regions 2100A, 2100B, 2200, 2300 is formed between two of the plurality of fins 2500, 2600, 2700, 2800, 2900. In some embodiments, the plurality of fins 2500, 2600, 2700, 2800, 2900 are adjacent to each other. For example, the fin 2500 is adjacent to the fin 2600, the fin 2600 is adjacent to the fin 2700, and the fin 2700 is adjacent to the fin 2800, and so on.

The first isolation region 2100A of the plurality of isolation regions includes a first ALD layer 2110A and a second ALD layer 2120A. The first ALD layer 2110A includes a first trench 2112A. The first trench 2112A of the first ALD layer 2110A is filled up with the second ALD layer 2120A. The first ALD layer 2110A and the second ALD layer 2120A are implanted with carbon (C) and nitrogen (N) respectively. A concentration which carbon implanted in the second ALD layer 2120A is higher than a concentration which carbon implanted in the first ALD layer 2110A, and a concentration which nitrogen implanted in the second ALD layer 2120A is substantially higher than a concentration which nitrogen implanted in the first ALD layer 2110A.

In some embodiments, the concentration which carbon implanted in the first ALD layer 2110A is about 1-3%, and the concentration which nitrogen implanted in the first ALD layer 2110A is about 5-20%. In various embodiments, the concentration which carbon implanted in the second ALD layer 2120A is about 5-15%, and the concentration which nitrogen implanted in the second ALD layer 2120A is about 10-30%. The concentration which elements implanted in the layers described above is given for illustrative purposes. Various concentrations which elements implanted in the layers are within the contemplated scope of the present disclosure.

In various embodiments, the structure of an isolation region 2100B of the plurality of isolation regions is the similar to the structure of the first isolation region 2100A of the plurality of isolation regions. The difference between the isolation region 2100A and the isolation region 2100B is that the width W2 of the isolation region 2100B is larger than the width W1 of the isolation region 2100A. The difference of the widths of the isolation regions described above is given for illustrative purposes. Various differences of the widths of the isolation regions are within the contemplated scope of the present disclosure.

In some embodiments, the second isolation region 2200 of the plurality of isolation regions includes a third ALD layer 2210, a fourth ALD layer 2220, and a first FCVD layer 2230. The third ALD layer 2210 includes a second trench 2212. The fourth ALD layer 2220 is formed in the second trench 2212 of the third ALD layer 2210. The FCVD layer 2230 is formed in the second trench 2212 of the third ALD layer 2210 and on the fourth ALD layer 2220.

The third ALD layer 2210 and the fourth ALD layer 2220 are implanted with carbon (C) and nitrogen (N). A concentration which carbon implanted in the fourth ALD layer 2220 is higher than a concentration which carbon implanted in the third ALD layer 2210, and a concentration which nitrogen implanted in the fourth ALD layer 2220 is higher than a concentration which nitrogen implanted in the third ALD layer 2210.

In various embodiments, the third isolation region 2300 of the plurality of isolation regions includes a fifth ALD layer 2310, a sixth ALD layer 2320, a second FCVD layer 2330, and a seventh ALD layer 2340. The fifth ALD layer 2310 includes a third trench 2312. The sixth ALD layer 2320 is formed in the third trench 2312 of the fifth ALD layer 2310, and the sixth ALD layer 2320 includes a fourth trench 2322. The second FCVD layer 2330 is formed in the fourth trench 2322 of the sixth ALD layer 2320. The seventh ALD layer 2340 is formed on the second FCVD layer 2330.

The fifth ALD layer 2310, the sixth ALD layer 2320, and the seventh ALD layer 2340 are implanted with carbon (C) and nitrogen (N). A concentration which carbon implanted in the sixth ALD layer 2320 and the seventh ALD layer 2340 are higher than a concentration which carbon implanted in the fifth ALD layer 2310, and a concentration which nitrogen implanted in the sixth ALD layer 2320 and the seventh ALD layer 2340 is higher than a concentration which nitrogen implanted in the fifth ALD layer 2310.

In some approaches, ALD layers as an oxide spacer are needed in semiconductor device to define dummy fin width. However, it is suffered from fin bonding and spacer merge seam issues.

Compared to the approaches above, in the present disclosure, the ALD layers with carbon (C) and nitrogen (N) doping in the semiconductor 2000 achieve better fin bonding and spacer merge seam performance. In addition, the ALD layers with carbon (C) and nitrogen (N) doping is by Si—C—ON bonding, and such bonding leads to better stability.

FIGS. 51-61 are process flows for manufacturing the semiconductor device 2000 in FIG. 50, in accordance with some embodiments of the present disclosure.

Figure 52:
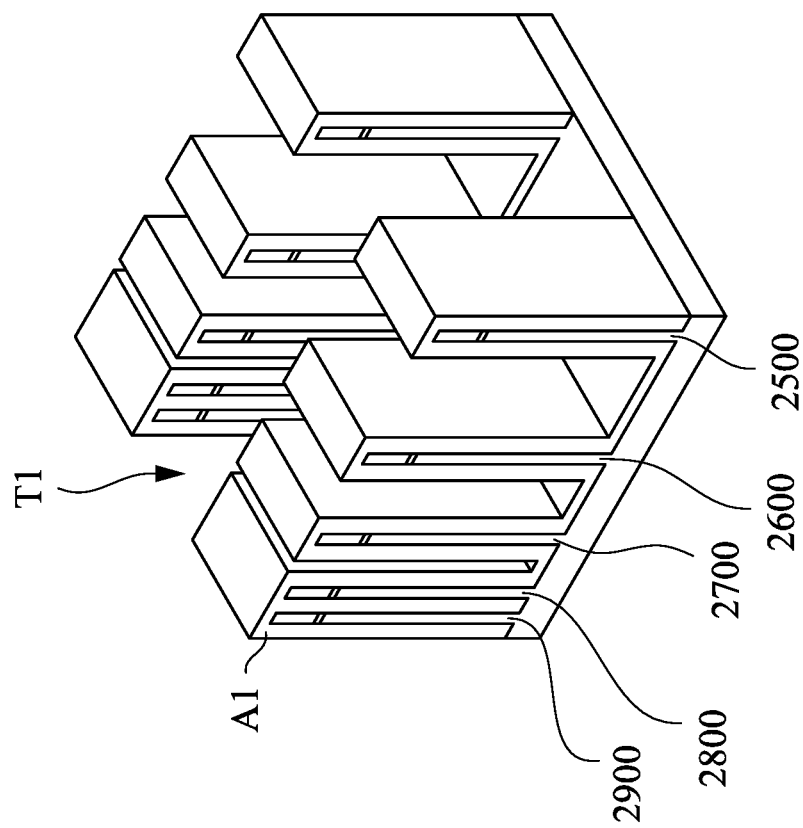
FIGS. 51-61 are process flows for manufacturing the semiconductor device in FIG. 50, in accordance with some embodiments of the present disclosure.
Figure 51:
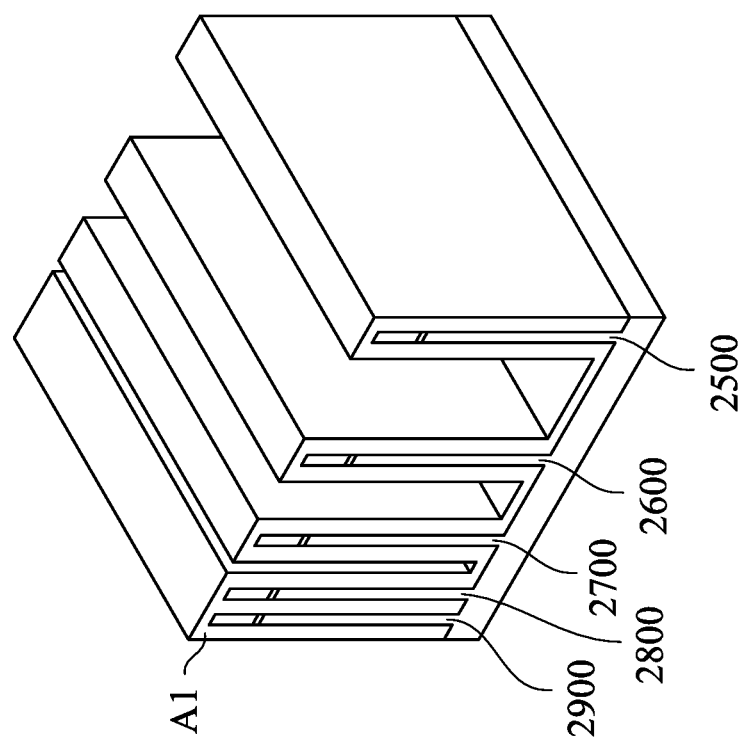

As illustratively shown in FIG. 51, a plurality of fins 2500, 2600, 2700, 2800, 2900 are formed by etching process, and an ALD material A1 as a spacer is formed on the fins 2500, 2600, 2700, 2800, 2900. Reference is made to FIG. 52, coarse cut etching is performed to the fins 2500, 2600, 2700, 2800, 2900 and the ALD material A1, and a new trench T1 is formed.

Figure 54:
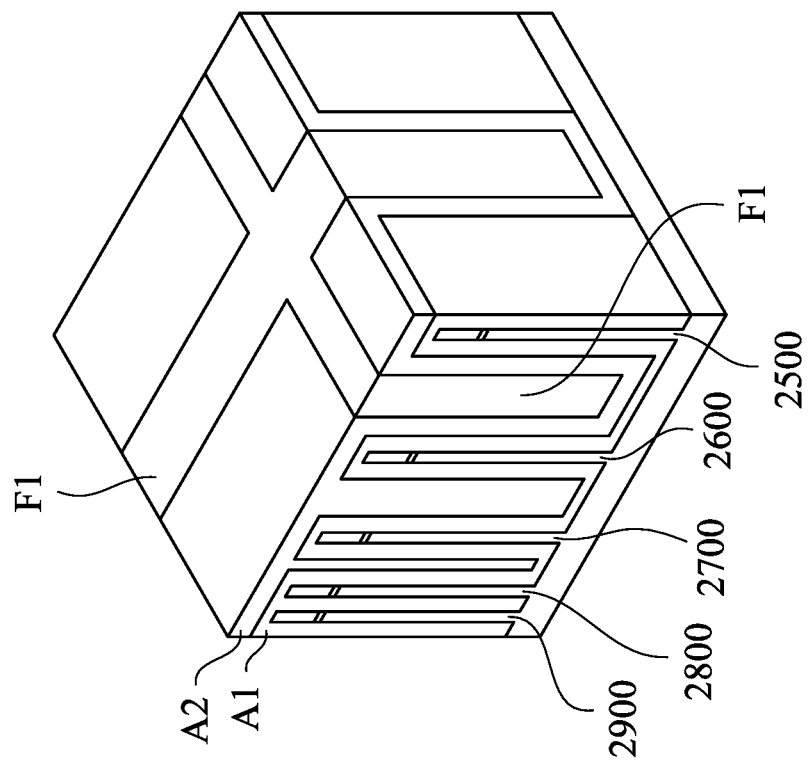
Figure 53:
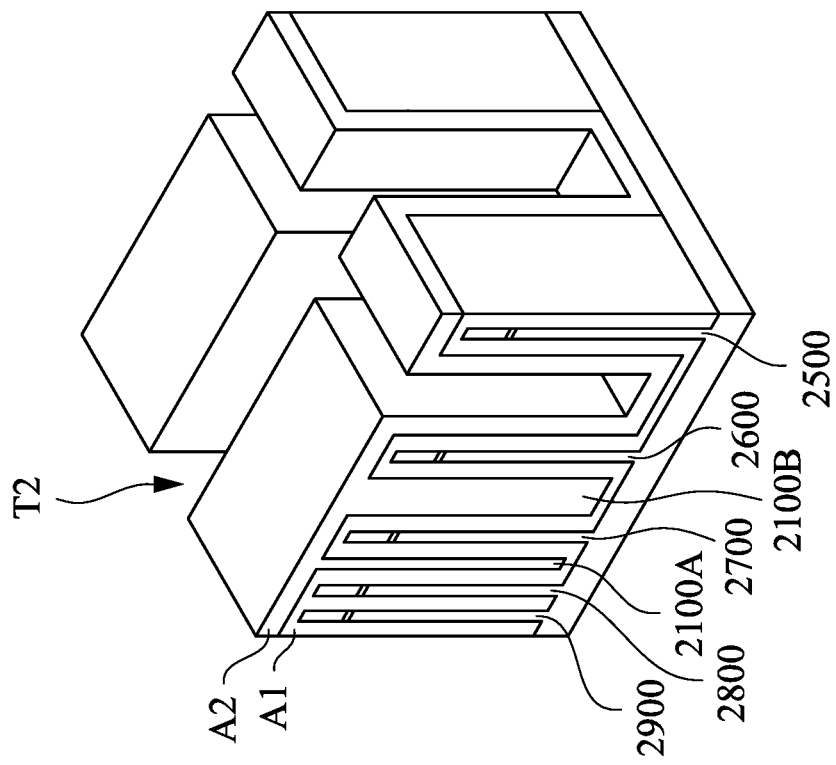

Referring to FIG. 53, an ALD material A2 is formed on the structure as shown in FIG. 52. The ALD layers 2100A, 2100B as dummy fins are therefore formed. In FIG. 54, a FCVD layer F1 is formed on the structure in FIG. 53 first, and a CMP process is performed thereafter. The FCVD layer F1 is polished and stopped at the ALD material A2; and therefore, the FCVD layer F1 fills up the trench T2 as shown in FIG. 53.

Figure 56:
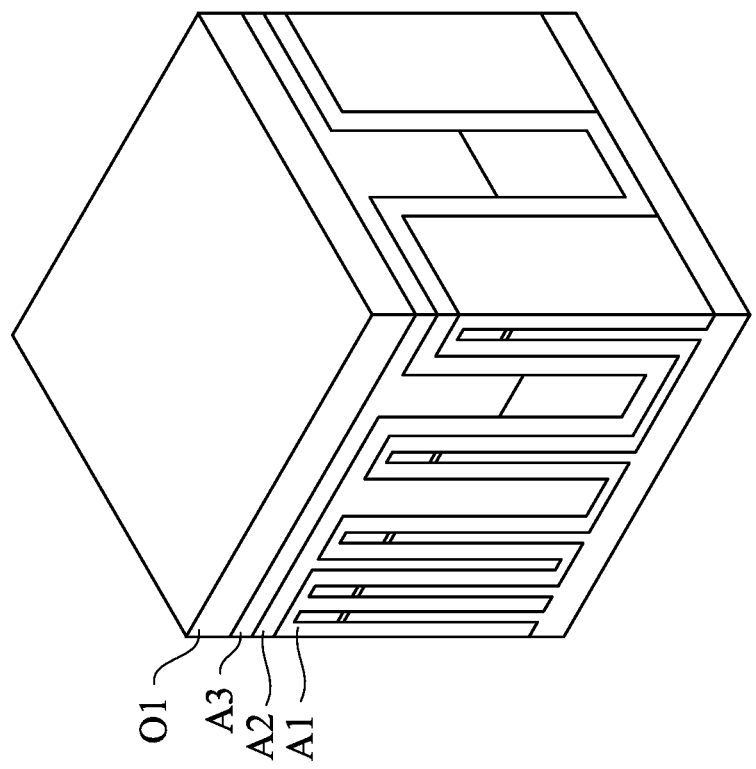
Figure 55:
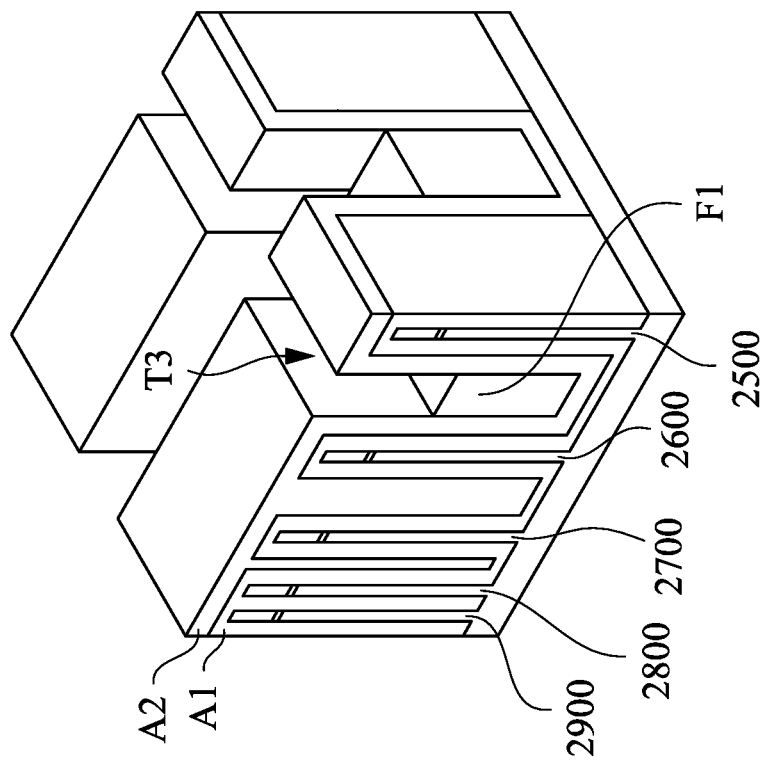

As illustratively shown in FIG. 55, an etching process is performed to etch the FCVD F1, and a trench T3 is formed. In FIG. 56, an ALD material A3 fills up the trench T3 as shown in FIG. 55, and an oxide layer O1 is formed on the ALD material A3. In some embodiments, the oxide layer O1 is a PEOX layer.

Figures 57, 58:
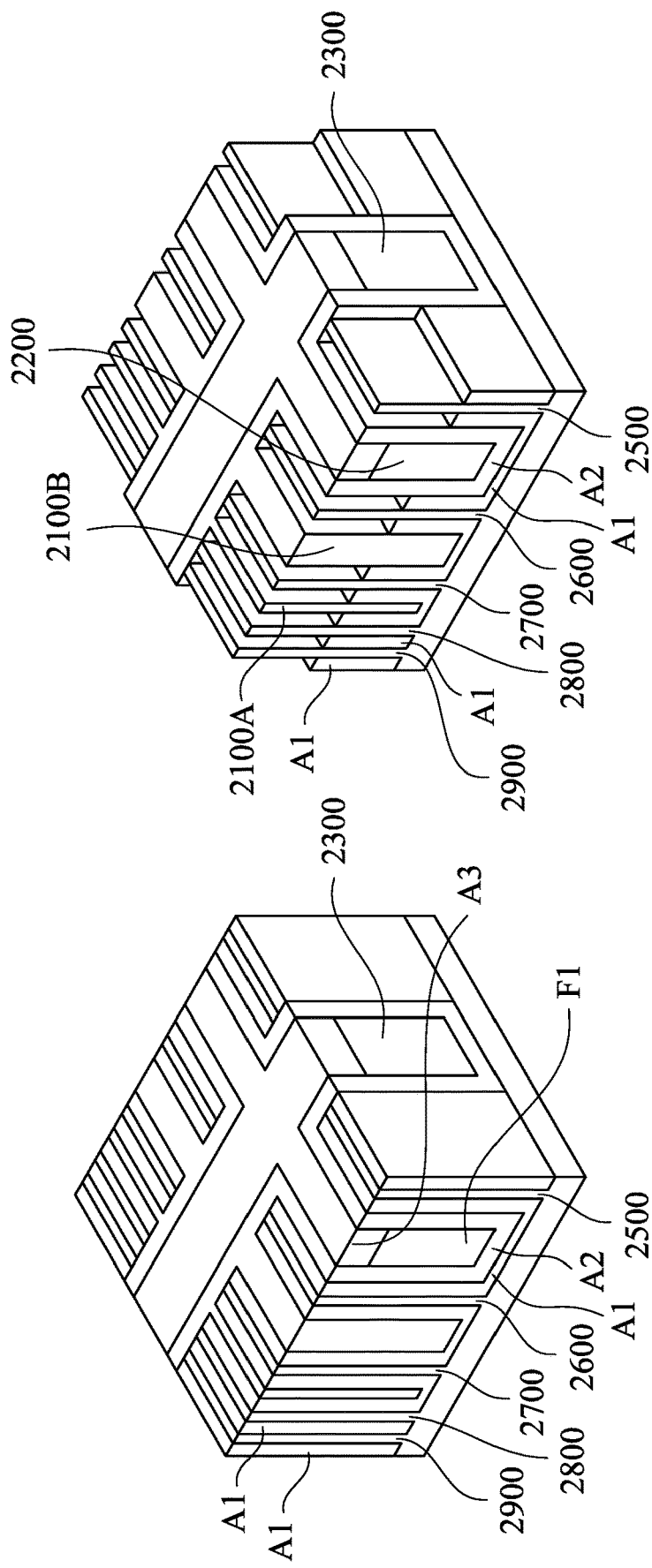
Figure 60:
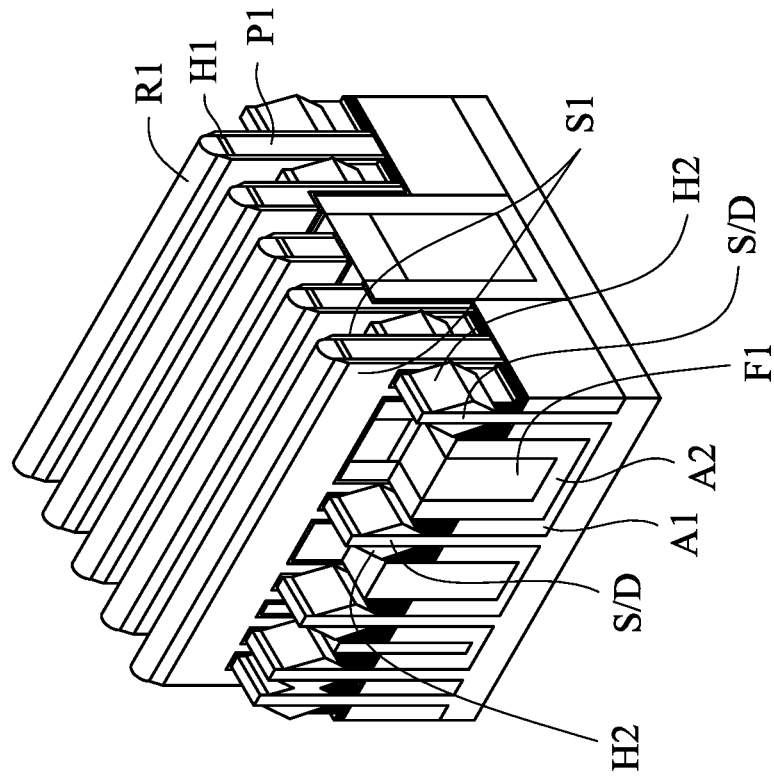
Figure 59:
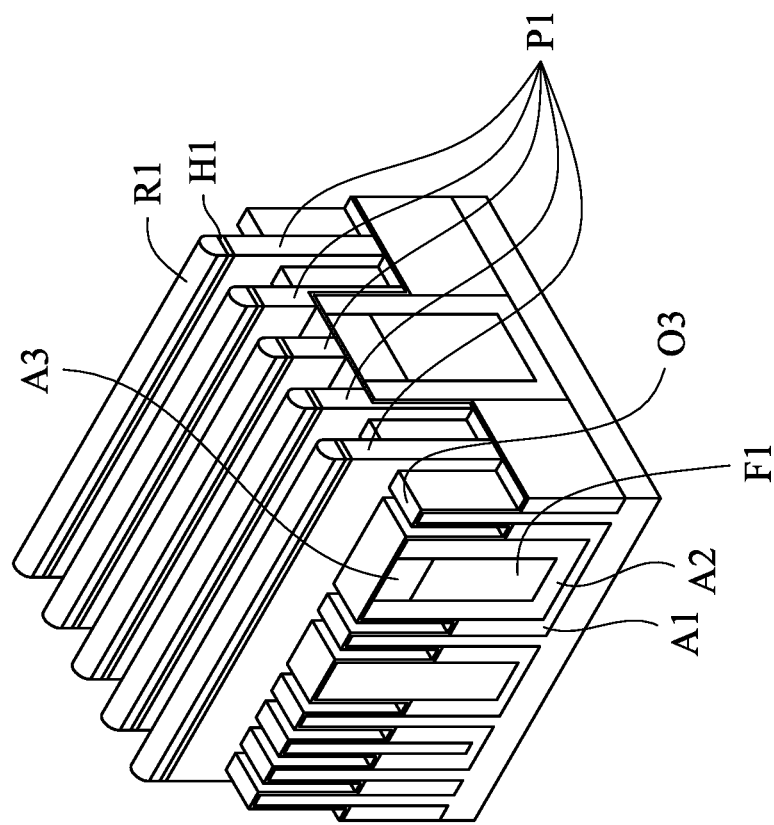
Figure 61:
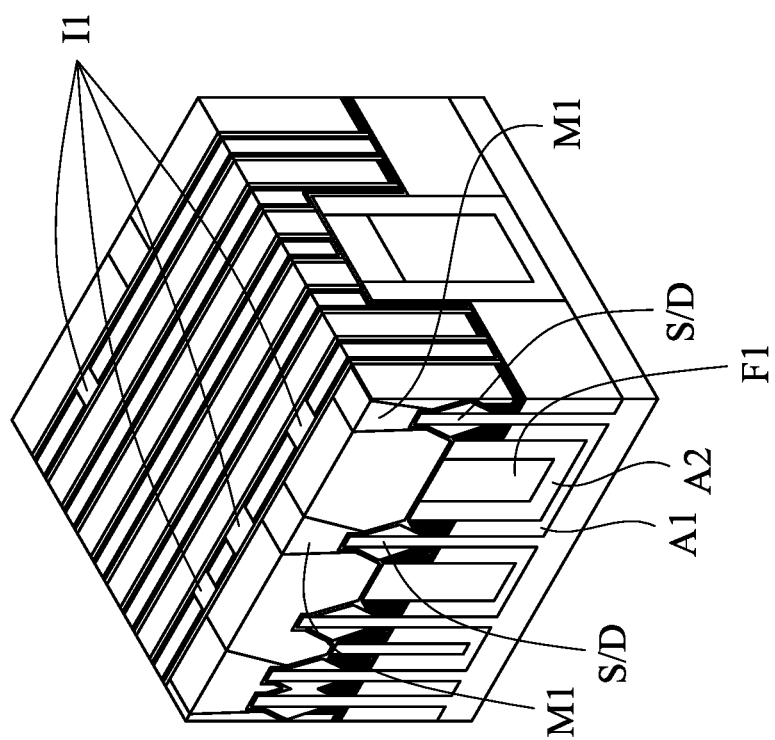

Reference is made to FIGS. 57-61, since the processes thereof are similar to the processes in FIGS. 26-31, the detailed description regarding the processes is therefore omitted for the sake of brevity. However, there are some differences in the processes, which are described below. In FIG. 58, due to the structure difference, the STI process is performed to remove the upper portion of the ALD material A1 rather than the oxide layer O1 in FIG. 27. Referring to FIG. 60, the shapes of the source/drain (S/D) epi are diamond rather than helmet in FIG. 29.

In some embodiments, a semiconductor device includes a substrate, a first semiconductor fin and a second semiconductor fin, a gate structure, a shallow trench isolation (STI) oxide, and a dielectric layer. The first semiconductor fin and a second semiconductor fin extend upwardly from the substrate. The gate structure extends across the first and second semiconductor fins. The shallow trench isolation (STI) oxide has a horizontal portion extending along a top surface of the substrate and vertical portions extending upwardly from the horizontal portion along the first and second semiconductor fins. The dielectric layer has a horizontal portion extending along a top surface of the horizontal portion of the STI oxide and vertical portions extending upwardly from the horizontal portion of the dielectric layer to a position higher than top ends of the vertical portions of the STI oxide.

In some embodiments, a semiconductor device includes a substrate, a first gate structure, a second gate structure, a first semiconductor fin, a second semiconductor fin, a dielectric layer, and a shallow trench isolation (STI) oxide. The first gate structure extends above the substrate along a first direction. The second gate structure extends above the substrate along the first direction. The first semiconductor fin extends along a second direction perpendicular to the first direction and is straddled by the first gate structure. The second semiconductor fin extends along the second direction and is straddled by the second gate structure. The dielectric layer is interposed between a longitudinal end of the first semiconductor fin and a longitudinal end of the second semiconductor fin. The shallow trench isolation (STI) oxide is on either side of the dielectric layer and has a topmost surface set back from a topmost surface of the dielectric layer. The STI oxide has a lower impurity concentration than the dielectric layer.

In some embodiments, a method for manufacturing a semiconductor device includes forming first and second semiconductor fins extending along a first direction; performing an atomic layer deposition (ALD) process to deposit an ALD layer over first and second semiconductor fins; after performing the ALD process, performing a flowable chemical vapor deposition (FCVD) process to form a FCVD layer between the first and second semiconductor fins; recessing the FCVD layer to a level lower than a top surface of the ALD layer; after recessing the FCVD layer, performing a chemical mechanical polish (CMP) process on the ALD layer, wherein the CMP process stops at the FCVD layer; after performing the CMP process, recessing the ALD layer to a level lower than a top surface of the FCVD layer; and forming a gate structure extending across the first and second semiconductor fins.

In some embodiments, a semiconductor device includes a substrate, a first semiconductor fin, a second semiconductor fin, a gate structure, a plurality of source/drain structures, a shallow trench isolation (STI) oxide, and a dielectric layer. The first semiconductor fin extends upwardly from the substrate. The second semiconductor fin extends upwardly from the substrate. The gate structure extends across the first and second semiconductor fins. The source/drain structures are on the first and second semiconductor fins. The STI oxide extends continuously between the first and second semiconductor fins and has a U-shaped profile when viewed in a cross section taken along a lengthwise direction of the gate structure. The dielectric layer is partially embedded in the STI oxide and has a U-shaped profile when viewed in the cross section taken along the lengthwise direction of the gate structure. In some embodiments, the dielectric layer has a higher impurity concentration than the STI oxide. In some embodiments, the STI oxide is doped with carbon. In some embodiments, the STI oxide is doped with nitrogen. In some embodiments, the dielectric layer is doped with carbon. In some embodiments, the dielectric layer is doped with nitrogen. In some embodiments, a first carbon concentration in the dielectric layer is in a range from about 5% to about 15% and a second carbon concentration in the dielectric layer is in a range from about 1% to about 3%. In some embodiments, a first nitrogen concentration in the dielectric layer is in a range from about 10% to about 30% and a second nitrogen concentration in the dielectric layer is in a range from about 5% to about 20%. In some embodiments, the dielectric layer is doped with a second impurity different than a first impurity in the STI oxide. In some embodiments, the dielectric layer is doped with a second impurity that is the same as a first impurity in the STI oxide.

In some embodiments, a semiconductor device includes a substrate, a first semiconductor fin, a first gate structure, a second semiconductor fin, a second gate structure, a first dielectric layer, and a second dielectric layer. The first semiconductor fin extends upwardly from the substrate. The first gate structure extends across the first semiconductor fin. The second semiconductor fin extends upwardly from the substrate. second gate structure extending across the second semiconductor fin The first dielectric layer extends continuously between a longitudinal end of the first semiconductor fin and a longitudinal end of the second semiconductor fin and having a U-shaped profile when viewed in a cross section taken along a lengthwise direction of the first semiconductor fin. The second dielectric layer is embedded in the first dielectric layer and has a topmost surface set back from a topmost surface of the dielectric layer. In some embodiments, the first dielectric layer has a topmost surface level with a topmost surface of the first semiconductor fin. In some embodiments, the first dielectric layer is in contact with a top surface of the substrate. In some embodiments, the semiconductor device further comprising a third dielectric layer above the second dielectric layer and embedded in the first dielectric layer, wherein the third dielectric layer has a higher impurity concentration than the second dielectric layer. In some embodiments, the third dielectric layer is doped with germanium. In some embodiments, the third dielectric layer is doped with aluminum.

In some embodiments, a method for manufacturing a semiconductor device includes: forming first and second semiconductor fins extending upwardly from a substrate; forming an isolation oxide layer over and continuously between first and second semiconductor fins; forming a dielectric layer over the isolation oxide layer; performing a first chemical mechanical polish (CMP) process on the dielectric layer; after performing the first CMP process, etching back the dielectric layer to fall below a top surface of the isolation oxide layer; after etching back the dielectric layer, implanting the dielectric layer with an impurity; after implanting the dielectric layer, recessing the top surface of the isolation oxide layer to a level lower than the top surface of the dielectric layer; and forming sources/drains structure on the first and second semiconductor fins. In some embodiments, the method further comprising: after implanting the dielectric layer, performing a second CMP process on the isolation oxide layer, wherein the second CMP process stops at the implanted dielectric layer. In some embodiments, the impurity comprises germanium. In some embodiments, the impurity comprises carbon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first semiconductor fin extending upwardly from the substrate;
   a second semiconductor fin extending upwardly from the substrate;
   a gate structure extending across the first and second semiconductor fins;
   a plurality of source/drain structures on the first and second semiconductor fins;
   a shallow trench isolation (STI) oxide extending continuously between the first and second semiconductor fins and having a U-shaped profile when viewed in a cross section taken along a lengthwise direction of the gate structure; and
   a dielectric layer partially embedded in the STI oxide and having a U-shaped profile when viewed in the cross section taken along the lengthwise direction of the gate structure, wherein the dielectric layer has a higher impurity concentration than the STI oxide.

2. The semiconductor device of claim 1, wherein the STI oxide is doped with carbon.

3. The semiconductor device of claim 1, wherein the STI oxide is doped with nitrogen.

4. The semiconductor device of claim 1, wherein the dielectric layer is doped with carbon.

5. The semiconductor device of claim 1, wherein the dielectric layer is doped with nitrogen.

6. The semiconductor device of claim 1, wherein a carbon concentration in the dielectric layer is in a range from about 5% to about 15%, and a carbon concentration in the STI oxide is in a range from about 1% to about 3%.

7. The semiconductor device of claim 1, wherein a nitrogen concentration in the dielectric layer is in a range from about 10% to about 30%, and a nitrogen concentration in the STI oxide is in a range from about 5% to about 20%.

8. The semiconductor device of claim 1, wherein the dielectric layer is doped with an impurity different than an impurity in the STI oxide.

9. The semiconductor device of claim 1, wherein the dielectric layer is doped with an impurity that is the same as an impurity in the STI oxide.

10. A semiconductor device, comprising:
    a substrate;
    a first semiconductor fin extending upwardly from the substrate;
    a first gate structure extending across the first semiconductor fin;
    a second semiconductor fin extending upwardly from the substrate;
    a second gate structure extending across the second semiconductor fin;
    a first dielectric layer extending continuously between a longitudinal end of the first semiconductor fin and a longitudinal end of the second semiconductor fin and having a U-shaped profile when viewed in a cross section taken along a lengthwise direction of the first semiconductor fin; and
    a second dielectric layer embedded in the first dielectric layer and having a topmost surface set back from a topmost surface of the first dielectric layer.

11. The semiconductor device of claim 10, wherein the topmost surface of the first dielectric layer is level with a topmost surface of the first semiconductor fin.

12. The semiconductor device of claim 10, wherein the first dielectric layer is in contact with a top surface of the substrate.

13. The semiconductor device of claim 10, further comprising a third dielectric layer above the second dielectric layer and embedded in the first dielectric layer, wherein the third dielectric layer has a higher impurity concentration than the second dielectric layer.

14. The semiconductor device of claim 13 wherein the third dielectric layer is doped with germanium.

15. The semiconductor device of claim 13, wherein the third dielectric layer is doped with aluminum.

16. A method for manufacturing a semiconductor device, comprising:
    forming first and second semiconductor fins extending upwardly from a substrate;
    forming an isolation oxide layer over and continuously between the first and second semiconductor fins;
    forming a dielectric layer over the isolation oxide layer;
    performing a first chemical mechanical polish (CMP) process on the dielectric layer;

after performing the first CMP process, etching back the dielectric layer to fall below a top surface of the isolation oxide layer;

after etching back the dielectric layer, implanting the dielectric layer with an impurity;

after implanting the dielectric layer, recessing the top surface of the isolation oxide layer to a level lower than a top surface of the dielectric layer; and forming sources/drains structure on the first and second semiconductor fins.

17. The method of claim 16, further comprising:

after implanting the dielectric layer, performing a second CMP process on the isolation oxide layer, wherein the second CMP process stops at the implanted dielectric layer.

18. The method of claim 16, wherein the impurity comprises germanium.

19. The method of claim 16, wherein the impurity comprises carbon.

20. The semiconductor device of claim 1, wherein the dielectric layer has a topmost surface in a position level with a topmost surface of the first semiconductor fin.

* * * * *